United States Patent
Kim et al.

(10) Patent No.: US 11,978,402 B2
(45) Date of Patent: May 7, 2024

(54) GATE DRIVER AND DISPLAY DEVICE INCLUDING THE SAME

(71) Applicant: Samsung Display Co., LTD., Yongin-si (KR)

(72) Inventors: Sunho Kim, Seongnam-si (KR); Yoomin Ko, Suwon-si (KR); Hyewon Kim, Seoul (KR); Juchan Park, Seoul (KR); Pilsuk Lee, Suwon-si (KR); Chung Sock Choi, Seoul (KR); Sungjin Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/174,521

(22) Filed: Feb. 24, 2023

(65) Prior Publication Data

US 2023/0360605 A1 Nov. 9, 2023

(30) Foreign Application Priority Data

May 6, 2022 (KR) .................. 10-2022-0056144

(51) Int. Cl.
*G09G 3/3241* (2016.01)
*G09G 3/3266* (2016.01)
*H03K 17/687* (2006.01)

(52) U.S. Cl.
CPC ......... *G09G 3/3241* (2013.01); *G09G 3/3266* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 2006/0061385 A1* | 3/2006 | Jinta | G11C 19/00 326/81 |
| 2021/0265449 A1* | 8/2021 | Son | H10K 59/126 |
| 2023/0169917 A1* | 6/2023 | Xiao | G09G 3/3266 345/204 |

FOREIGN PATENT DOCUMENTS

| | | |
|---|---|---|
| KR | 10-0814877 B1 | 3/2008 |
| KR | 10-2019-0012719 A | 2/2019 |
| KR | 10-1975581 B1 | 9/2019 |
| KR | 10-2021-0083918 A | 7/2021 |

* cited by examiner

*Primary Examiner* — Nicholas J Lee
(74) *Attorney, Agent, or Firm* — Lewis Roca Rothgerber Christie LLP

(57) ABSTRACT

A gate driver includes: a signal generator configured to generate a gate signal, and output the gate signal to a first output terminal; and an inverted signal generator configured to generate an inverted gate signal based on the gate signal, and output the inverted gate signal to a second output terminal, wherein the inverted signal generator includes: a first transistor connected between a first node connected to the second output terminal and a first driving power supply terminal, and including a PMOS transistor; and a second transistor connected between the first node and a second driving power supply terminal, and including an NMOS transistor, and wherein a second node connected to the first output terminal is connected to a gate electrode of each of the first and second transistors.

11 Claims, 11 Drawing Sheets

GATE DRIVER AND DISPLAY DEVICE INCLUDING THE SAME

CROSS-REFERENCE TO RELATED APPLICATION

The present application claims priority to and the benefit of Korean Patent Application No. 10-2022-0056144 filed on May 6, 2022 in the Korean Intellectual Property Office (KIPO), the entire disclosure of which is incorporated herein by reference.

BACKGROUND

1. Field

Aspects of some embodiments relate generally to a gate driver and a display device including the gate driver.

2. Description of the Related Art

Flat panel display devices may be used as display devices, and have generally replaced cathode ray tube display devices over time due to lightweight and thin characteristics thereof. As representative examples of such flat panel display devices, there are a liquid crystal display device, an organic light emitting display device, a quantum dot display device, and the like.

The display device may include a plurality of pixels, and the pixels may include a transistor, a capacitor, and the like. The transistors included in the pixel have been configured only as a P-type metal oxide semiconductor (PMOS) transistor including polysilicon, or configured only as an N-type metal oxide semiconductor (NMOS) transistor including a metal oxide semiconductor.

Recently, the transistors included in the pixel may include both the PMOS transistor and the NMOS transistor. When the transistors included in the pixel includes both the PMOS transistor and the NMOS transistor, a new gate driver may be additionally provided to the display device to drive the PMOS transistor and the NMOS transistor. In this case, due to the additional provision of the new gate driver, power consumption and a dead space of the display device may be increased.

The above information disclosed in this Background section is only for enhancement of understanding of the background and therefore the information discussed in this Background section does not necessarily constitute prior art.

SUMMARY

Aspects of some embodiments of the present disclosure include a gate driver.

Aspects of some embodiments of the present disclosure include a display device including the gate driver.

According to some embodiments, a gate driver may include a signal generator configured to generate a gate signal, and output the gate signal to a first output terminal and an inverted signal generator configured to generate an inverted gate signal based on the gate signal, and output the inverted gate signal to a second output terminal. According to some embodiments, the inverted signal generator may include a first transistor connected between a first node connected to the second output terminal and a first driving power supply terminal, and including a PMOS transistor and a second transistor connected between the first node and a second driving power supply terminal, and including an NMOS transistor. In addition, according to some embodiments, a second node connected to the first output terminal may be connected to a gate electrode of each of the first and second transistors.

According to some embodiments, the gate signal and the inverted gate signal may be signals inverted with respect to each other and having a same voltage level.

According to some embodiments, a voltage corresponding to the gate signal may be applied to the gate electrode of each of the first and second transistors.

According to some embodiments, the second transistor may further include a lower gate electrode.

According to some embodiments, the first transistor and the second transistor may be connected in series.

According to some embodiments, a voltage applied to the second node may be different from a voltage applied to the second driving power supply terminal.

According to some embodiments, a display device may include a display panel including first to $m^{th}$ pixel rows in which pixels are arranged, where m is an integer greater than or equal to 2, and a gate driver including first to $m^{th}$ signal generators configured to generate first to $m^{th}$ gate signals, respectively and first to $m^{th}$ inverted signal generators configured to generate first to $m^{th}$ inverted gate signals, respectively. Here, an $(n-1)^{th}$ gate signal, where n is an integer between 1 and m, generated by an $(n-1)^{th}$ signal generator among the first to $m^{th}$ signal generators, an $(n-1)^{th}$ inverted gate signal generated by an $(n-1)^{th}$ inverted signal generator among the first to $m^{th}$ inverted signal generators, an $n^{th}$ gate signal generated by an $n^{th}$ signal generator among the first to $m^{th}$ signal generators, and an $n^{th}$ inverted gate signal generated by an $n^{th}$ inverted signal generator among the first to $m^{th}$ inverted signal generators may be provided to an $n^{th}$ pixel row among the first to $m^{th}$ pixel rows.

According to some embodiments, the $(n-1)^{th}$ gate signal and the $(n-1)^{th}$ inverted gate signal may be signals inverted with respect to each other and having a same voltage level. In addition, the $n^{th}$ gate signal and the $n^{th}$ inverted gate signal may be signals inverted with respect to each other and having a same voltage level.

According to some embodiments, each of the pixels arranged in the $n^{th}$ pixel row may include a light emitting element configured to output a light based on a driving current, and including a first terminal and a second terminal, a first pixel transistor including a first terminal to which a first power supply voltage is applied, a second terminal connected to the first terminal of the light emitting element, and a gate terminal, and configured to generate the driving current, and a second pixel transistor including a first terminal to which a data voltage is applied, a second terminal connected to the first terminal of the first pixel transistor, and a gate terminal to which the $n^{th}$ gate signal is applied.

According to some embodiments, each of the pixels arranged in the $n^{th}$ pixel row may further include a third pixel transistor including a first terminal connected to the second terminal of the first pixel transistor, a second terminal connected to the gate terminal of the first pixel transistor, and a first gate terminal to which the $n^{th}$ inverted gate signal is applied.

According to some embodiments, the third pixel transistor may further include a second gate terminal connected to the first gate terminal of the third pixel transistor, and configured to function as a back gate. In addition, according to some embodiments, the third pixel transistor may be an NMOS transistor.

According to some embodiments, each of the pixels arranged in the n$^{th}$ pixel row may further include a fourth pixel transistor including a first terminal to which a first initialization voltage is applied, a second terminal connected to the second terminal of the third pixel transistor, and a first gate terminal to which the (n−1)$^{th}$ inverted gate signal is applied.

According to some embodiments, the fourth pixel transistor may further include a second gate terminal connected to the first gate terminal of the fourth pixel transistor, and configured to function as a back gate. In addition, according to some embodiments, the fourth pixel transistor may be an NMOS transistor.

According to some embodiments, each of the pixels arranged in the n$^{th}$ pixel row may further include a fifth pixel transistor including a first terminal to which a second initialization voltage is applied, a second terminal connected to the first terminal of the light emitting element, and a gate terminal to which the (n−1)$^{th}$ gate signal is applied.

According to some embodiments, the first, second, and fifth pixel transistors may be PMOS transistors.

According to some embodiments, a display device may include a substrate including a display area and a peripheral area, a first pixel switching element in the display area on the substrate, and including a first active layer including a metal oxide semiconductor, a first gate electrode on the first active layer, and a first lower gate electrode under the first active layer, a first switching element in the peripheral area on the substrate, and including a second active layer including a metal oxide semiconductor, a second gate electrode on the second active layer, and a second lower gate electrode under the second active layer, and a pixel structure in the display area on the first pixel switching element. According to some embodiments, the first lower gate electrode and the second lower gate electrode may be on mutually different layers.

According to some embodiments, the display device may further include a second pixel switching element including a third active layer, a third gate electrode on the third active layer, and an electrode pattern on the third gate electrode and defined as a capacitor together with the third gate electrode.

According to some embodiments, the first lower gate electrode and the electrode pattern may be on a same layer. In addition, according to some embodiments, the second lower gate electrode and the third gate electrode may be on a same layer.

According to some embodiments, the display device may further include a gate insulating layer covering the third active layer, and in the display area and the peripheral area on the substrate, and an interlayer insulating layer covering the third gate electrode and the second lower gate electrode, and in the display area and the peripheral area on the gate insulating layer.

According to some embodiments, a bottom surface of the first lower gate electrode may make contact with the interlayer insulating layer. In addition, according to some embodiments, a bottom surface of the second lower gate electrode may make contact with the gate insulating layer.

Therefore, a gate driver according to some embodiments may include a second signal generator including an inverter, so that the gate driver can simultaneously output a first gate signal and a second gate signal having the same voltage level as the first gate signal and having an inverted signal shape that is inverted with respect to a signal shape of the first gate signal.

In addition, a display device according to some embodiments may include a gate driver configured to generate first gate signals and second gate signals, so that the gate driver can generate four gate signals provided to a pixel by using the first gate signals and the second gate signals. Because the display device includes only one gate driver, a dead space of the display device can be relatively decreased.

Further, a display device according to some embodiments may include a second lower gate electrode that is spaced relatively far apart from a fourth active layer, so that a threshold voltage of a second switching element can be shifted. Accordingly, instances of a short current occurring in a first switching element and the second switching element may be prevented or reduced.

DETAILED DESCRIPTION

Hereinafter, embodiments of the present disclosure will be explained in detail with reference to the accompanying drawings.

Figure 1:
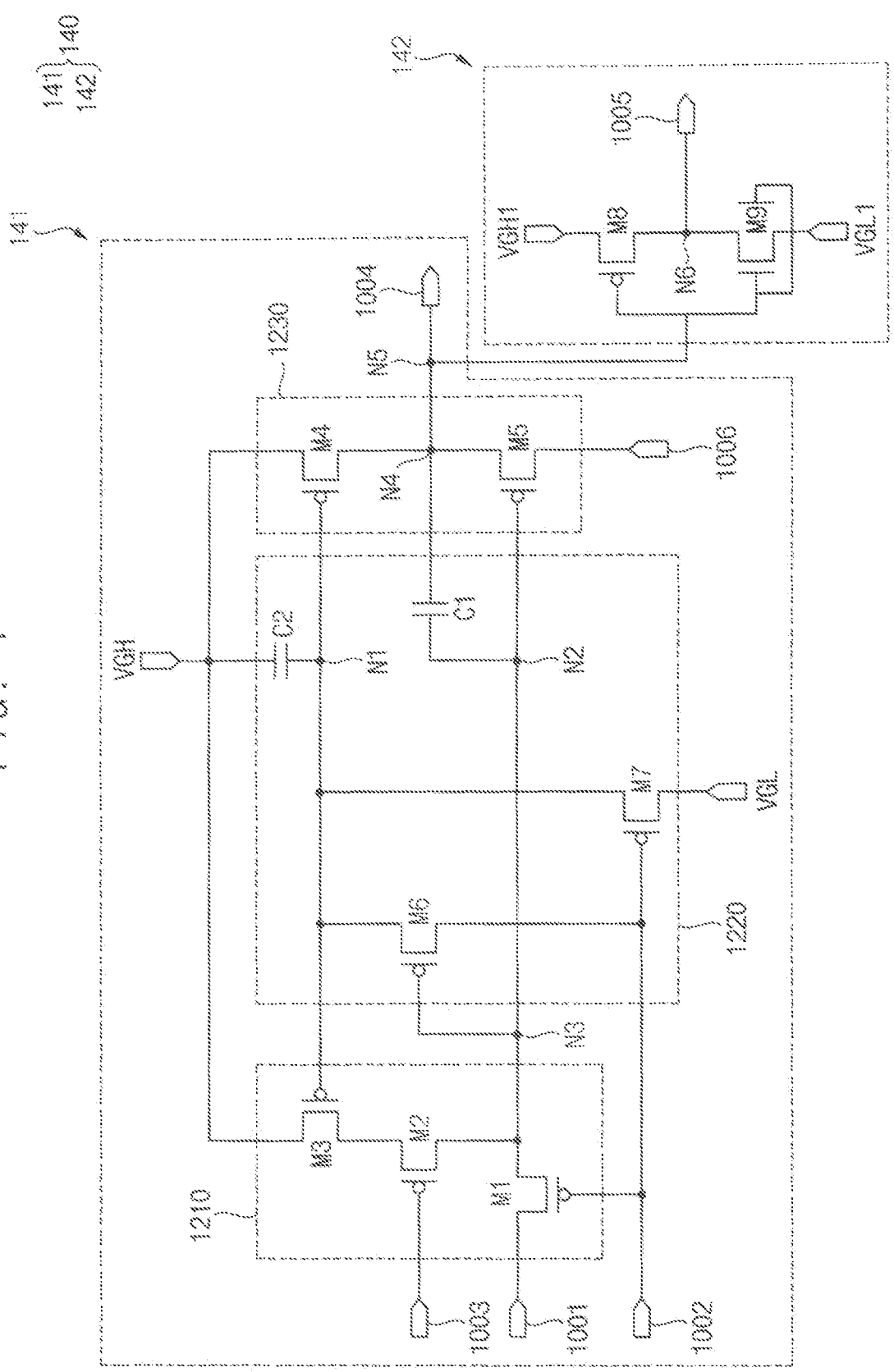
FIG. 1 is a circuit diagram illustrating a gate driver according to some embodiments.
Figure 2:
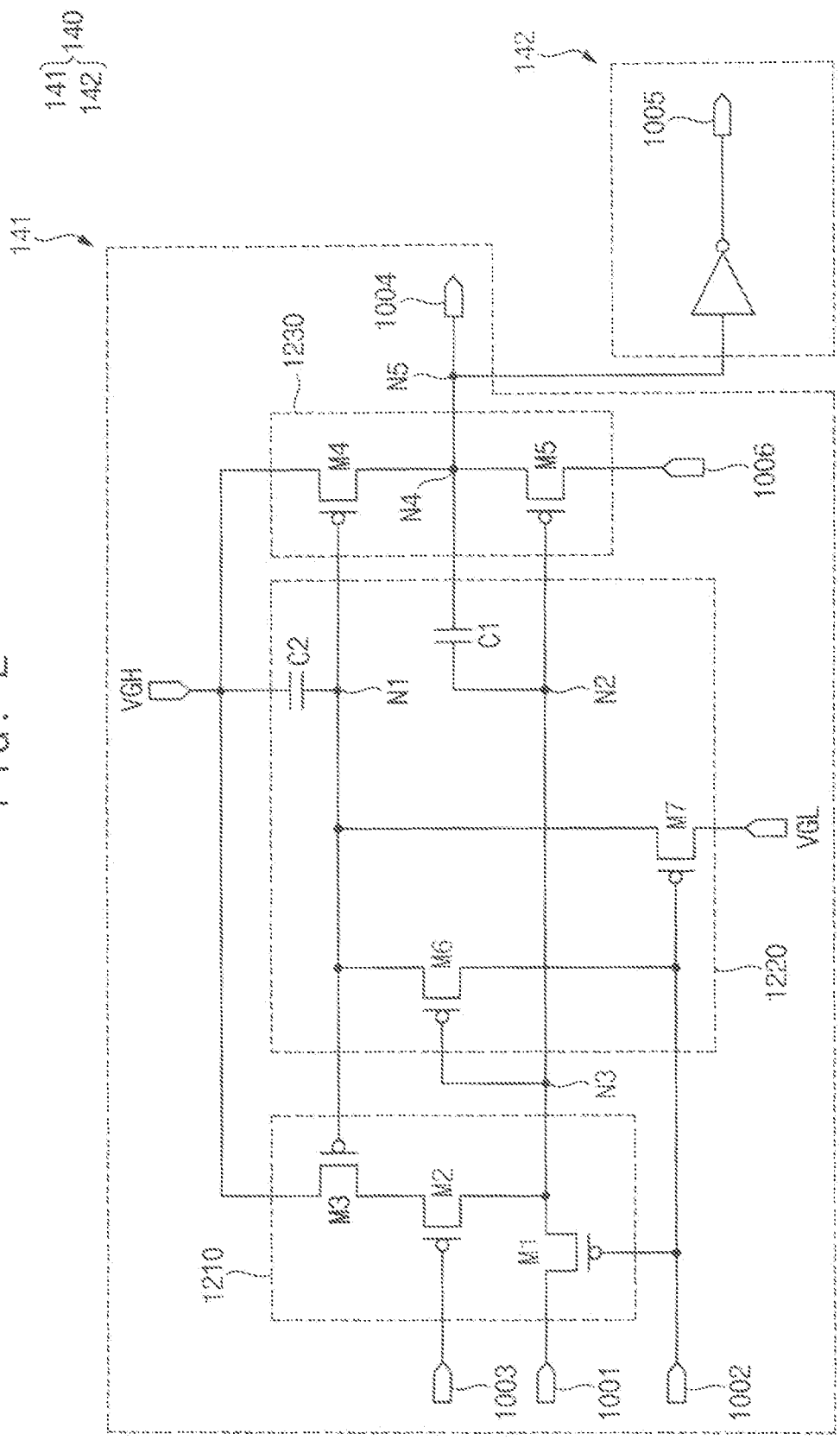
FIG. 2 is a diagram for describing the gate driver of FIG. 1.

FIG. 1 is a circuit diagram illustrating a gate driver according to some embodiments, and FIG. 2 is a diagram for describing the gate driver of FIG. 1.

Referring to FIGS. 1 and 2, a gate driver 140 may include a first signal generator 141 (or a signal generator), and a second signal generator 142 (or an inverted signal generator). In this case, the first signal generator 141 may include a first driver 1210, a second driver 1220, and an output unit 1230. In addition, the second signal generator 142 may include an eighth transistor M8 and a ninth transistor M9.

The output unit 1230 may include a fourth transistor M4 and a fifth transistor M5. The output unit 1230 may control a voltage supplied to a first output terminal 1004 based on voltages of a first node N1 and a second node N2. The fourth transistor M4 may be connected between a first driving power supply terminal VGH and a fourth node N4, and a gate electrode of the fourth transistor M4 may be connected to the first node N1. The fourth transistor M4 may control connection between the first driving power supply terminal VGH and the first output terminal 1004 based on the voltage applied to the first node N1. In this case, the first output terminal 1004 may be connected to the fourth node N4 (or a fifth node N5). The fifth transistor M5 may be connected between the first output terminal 1004 and a fourth input terminal 1006, and a gate electrode of the fifth transistor M5 may be connected to the second node N2. The fifth transistor M5 may control connection between the first output terminal 1004 and the fourth input terminal 1006 based on the voltage applied to the second node N2. The output unit 1230 may be driven as a buffer. According to some embodiments, the fourth transistor M4 and/or the fifth transistor M5 may have a configuration in which a plurality of transistors are connected in parallel.

The first driver 1210 may include a first transistor M1, a second transistor M2, and a third transistor M3. The first driver 1210 may control a voltage of a third node N3 based on clock signals supplied to a second input terminal 1002 and a third input terminal 1003. The first transistor M1 may be connected between the first input terminal 1001 and the third node N3, and a gate electrode of the first transistor M1 may be connected to the second input terminal 1002. The first transistor M1 may control connection between the first input terminal 1001 and the third node N3 based on the clock signal supplied to the second input terminal 1002. In this case, a gate signal (or a gate start signal) of a previous stage may be provided to the first input terminal 1001. The second transistor M2 and the third transistor M3 may be connected in series between the third node N3 and the first driving power supply terminal VGH. The second transistor M2 may be connected between the third transistor M3 and the third node N3, and a gate electrode of the second transistor M2 may be connected to the third input terminal 1003. The second transistor M2 may control connection between the third transistor M3 and the third node N3 based on the clock signal supplied to the third input terminal 1003. The third transistor M3 may be connected between the second transistor M2 and the first driving power supply terminal VGH, and a gate electrode of the third transistor M3 may be connected to the first node N1. The third transistor M3 may control connection between the second transistor M2 and the first driving power supply terminal VGH based on the voltage of the first node N1. According to some embodiments, the same clock signal may be applied to the third input terminal 1003 and the fourth input terminal 1006.

The second driver 1220 may include a sixth transistor M6, a seventh transistor M7, a first capacitor C1, and a second capacitor C2. The second driver 1220 may control the voltage of the first node N1 based on voltages of the second input terminal 1002 and the third node N3. The first capacitor C1 may be connected between the second node N2 and the fourth node N4. The first capacitor C1 may charge a voltage based on turn-on and turn-off of the fifth transistor M5. The second capacitor C2 may be connected between the first node N1 and the first driving power supply terminal VGH. The second capacitor C2 may charge the voltage applied to the first node N1. The sixth transistor M6 may be connected between the first node N1 and the second input terminal 1002, and a gate electrode of the sixth transistor M6 may be connected to the third node N3. The sixth transistor M6 may control connection between the first node N1 and the second input terminal 1002 based on the voltage of the third node N3. The seventh transistor M7 may be connected between the first node N1 and a second driving power supply terminal VGL, and a gate electrode of the seventh transistor M7 may be connected to the second input terminal 1002. The seventh transistor M7 may control connection between the first node N1 and the second driving power supply terminal VGL based on the clock signal of the second input terminal 1002.

Accordingly, the first signal generator 141 may output a first gate signal (e.g., a first gate signal GW of FIG. 3 or a gate signal) to the first output terminal 1004.

The eighth transistor M8 may be connected between a third driving power supply terminal VGH1 and a sixth node N6, and a gate electrode of the eighth transistor M8 may be connected to the fifth node N5.

The ninth transistor M9 may be connected between a fourth driving power supply terminal VGL1 and the sixth node N6, and a first gate electrode of the ninth transistor M9 may be connected to the fifth node N5. A second gate electrode of the ninth transistor M9 may be connected to the first gate electrode of the ninth transistor M9, and may function as a back gate electrode or a lower gate electrode.

According to some embodiments, the fifth node N5 may connect the fourth node N4 to the first output terminal 1004, and the eighth transistor M8 and the ninth transistor M9 may control connection between the third and fourth driving power supply terminals VGH1 and VGL1 and a second output terminal 1005 based on a voltage applied to the fifth node N5 (i.e., a voltage corresponding to the first gate signal). In this case, the second output terminal 1005 may be connected to the sixth node N6. In addition, the eighth transistor M8 may be a PMOS transistor, and the ninth transistor M9 may be a NMOS transistor. In other words, the eighth transistor M8 and the ninth transistor M9 may function as a CMOS transistor.

As shown in FIG. 2, the eighth transistor M8 and the ninth transistor M9 may function as an inverter. In other words, the inverter may invert a signal output to the first output terminal 1004. Furthermore, a voltage having the same voltage level may be provided to the third driving power supply terminal VGH1 and the first driving power supply terminal VGH, and a voltage having the same voltage level may be provided to the fourth driving power supply terminal VGL1 and the second driving power supply terminal VGL.

Accordingly, the second signal generator 142 may output a second gate signal (e.g., a second gate signal GC of FIG. 3 or an inverted gate signal) to the second output terminal 1005. As described above, the first gate signal and the second gate signal may be signals inverted with respect to each other and having the same voltage level.

Because the gate driver 140 according to some embodiments of the present disclosure includes the second signal generator 142 including the inverter, the second gate signal having the same voltage level as the first gate signal and having a signal shape that is inverted with respect to a signal shape of the first gate signal may be output simultaneously with the first gate signal.

Figure 3:
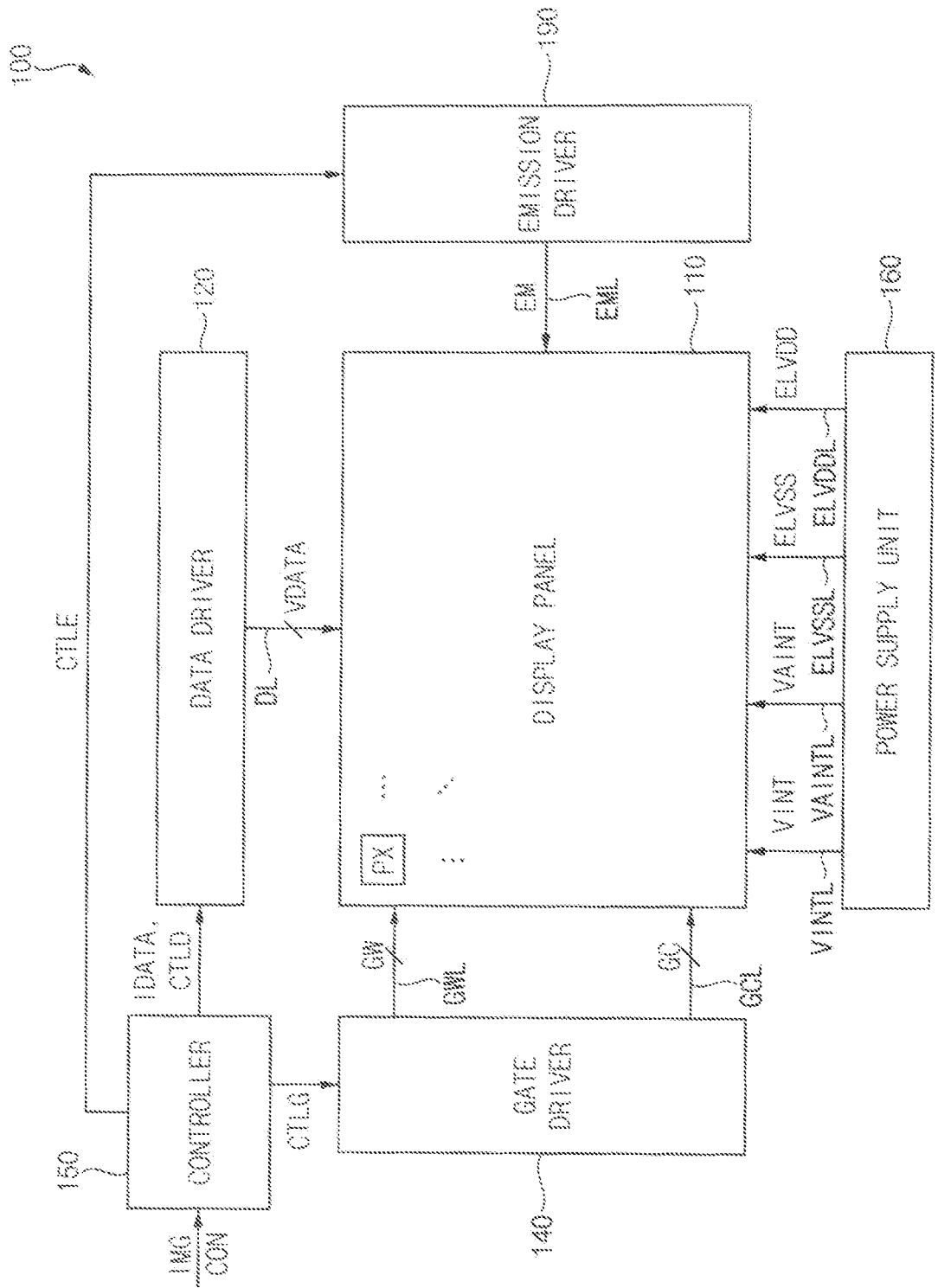
FIG. 3 is a block diagram illustrating a display device according to some embodiments.

FIG. 3 is a block diagram illustrating a display device according to some embodiments.

Referring to FIG. 3, a display device 100 may include a display panel 110 including a plurality of pixels PX, a controller 150, a data driver 120, a gate driver 140, an emission driver 190, a power supply unit 160, and the like.

The display panel 110 may include a plurality of data lines DL, a plurality of first gate lines GWL, a plurality of second gate lines GCL, a plurality of emission lines EML, a plurality of first power supply voltage lines ELVDDL, a plurality of second power supply voltage lines ELVSSL, a plurality of first initialization voltage lines VINTL, a plurality of second initialization voltage lines VAINTL, and a plurality of pixels PX connected to the lines.

Each of the pixels PX may include at least five pixel transistors, at least one pixel capacitor, and a light emitting element, and the display panel 110 may be a light emitting display panel. According to some embodiments, the display panel 110 may be a display panel of an organic light emitting display device (OLED). According to some embodiments, the display panel 110 may include a display panel of an inorganic light emitting display device (ILED), a display panel of a quantum dot display device (QDD), a display panel of a liquid crystal display device (LCD), a display panel of a field emission display device (FED), a display panel of a plasma display device (PDP), or a display panel of an electrophoretic display device (EPD).

The controller 150 (e.g., a timing controller (T-CON)) may receive image data IMG and an input control signal CON from an external host processor (e.g., an application processor (AP), a graphic processing unit (GPU), or a graphic card). The image data IMG may be RGB image data (or RGB pixel data) including red image data (or red pixel data), green image data (or green pixel data), and blue image data (or blue pixel data). In addition, the image data IMG may include information on a driving frequency. The control signal CON may include a vertical synchronization signal, a horizontal synchronization signal, an input data enable signal, a master clock signal, and the like, but the embodiments are not limited thereto.

The controller 150 may convert the image data IMG into input image data IDATA by applying an algorithm (e.g., dynamic capacitance compensation (DCC), etc.) for correcting image quality to the image data IMG supplied from the external host processor. According to some embodiments, when the controller 150 does not include an algorithm for improving image quality, the image data IMG may be output as the input image data IDATA. The controller 150 may supply the input image data IDATA to the data driver 120.

The controller 150 may generate a data control signal CTLD for controlling an operation of the data driver 120, a gate control signal CTLG for controlling an operation of the gate driver 140, and an emission control signal CTLE for controlling an operation of the emission driver 190 based on the input control signal CON. For example, the gate control signal CTLG may include a vertical start signal, gate clock signals, and the like, and the data control signal CTLD may include a horizontal start signal, a data clock signal, and the like.

The gate driver 140 may generate first gate signals GW and second gate signals GC based on the gate control signal CTLG received from the controller 150. The gate driver 140 may output the first gate signals GW and the second gate signals GC to the pixels PX connected to the first gate lines GWL and the second gate lines GCL, respectively. According to some embodiments, the gate driver 140 may provide the four gate signals provided to the pixel PX by using only the first gate signals GW and the second gate signals GC.

The emission driver 190 may generate emission signals EM based on the emission control signal CTLE received from the controller 150. The emission driver 190 may output the emission signals EM to the pixels PX connected to the emission lines EML.

The power supply unit 160 may generate a first initialization voltage VINT, a second initialization voltage VAINT, a first power supply voltage ELVDD, and a second power supply voltage ELVSS, and may provide the first initialization voltage VINT, the second initialization voltage VAINT, the first power supply voltage ELVDD, and the second power supply voltage ELVSS to the pixels PX through the first initialization voltage line VINTL, the second initialization voltage line VAINTL, the first power supply voltage line ELVDDL, and the second power supply voltage line ELVSSL.

The data driver 120 may receive the data control signal CTLD and the input image data IDATA from the controller 150. The data driver 120 may convert digital input image data IDATA into an analog data voltage by using a gamma reference voltage generated by a gamma reference voltage generator. In this case, the analog data voltage obtained by the conversion will be defined as a data voltage VDATA. The data driver 120 may output data voltages VDATA to the pixels PX connected to the data lines DL based on the data control signal CTLD. According to some embodiments, the data driver 120 and the controller 150 may be implemented as a single integrated circuit, and such an integrated circuit may be referred to as a timing controller-embedded data driver (TED).

Because the display device 100 according to some embodiments of the present disclosure includes the gate driver 140 configured to generate the first gate signals GW and the second gate signals GC, the gate driver 140 may generate four gate signals provided to the pixel PX by using the first gate signals GW and the second gate signals GC. Accordingly, because the display device 100 includes only one gate driver 140, a dead space of the display device 100 may be relatively decreased.

Figure 4:
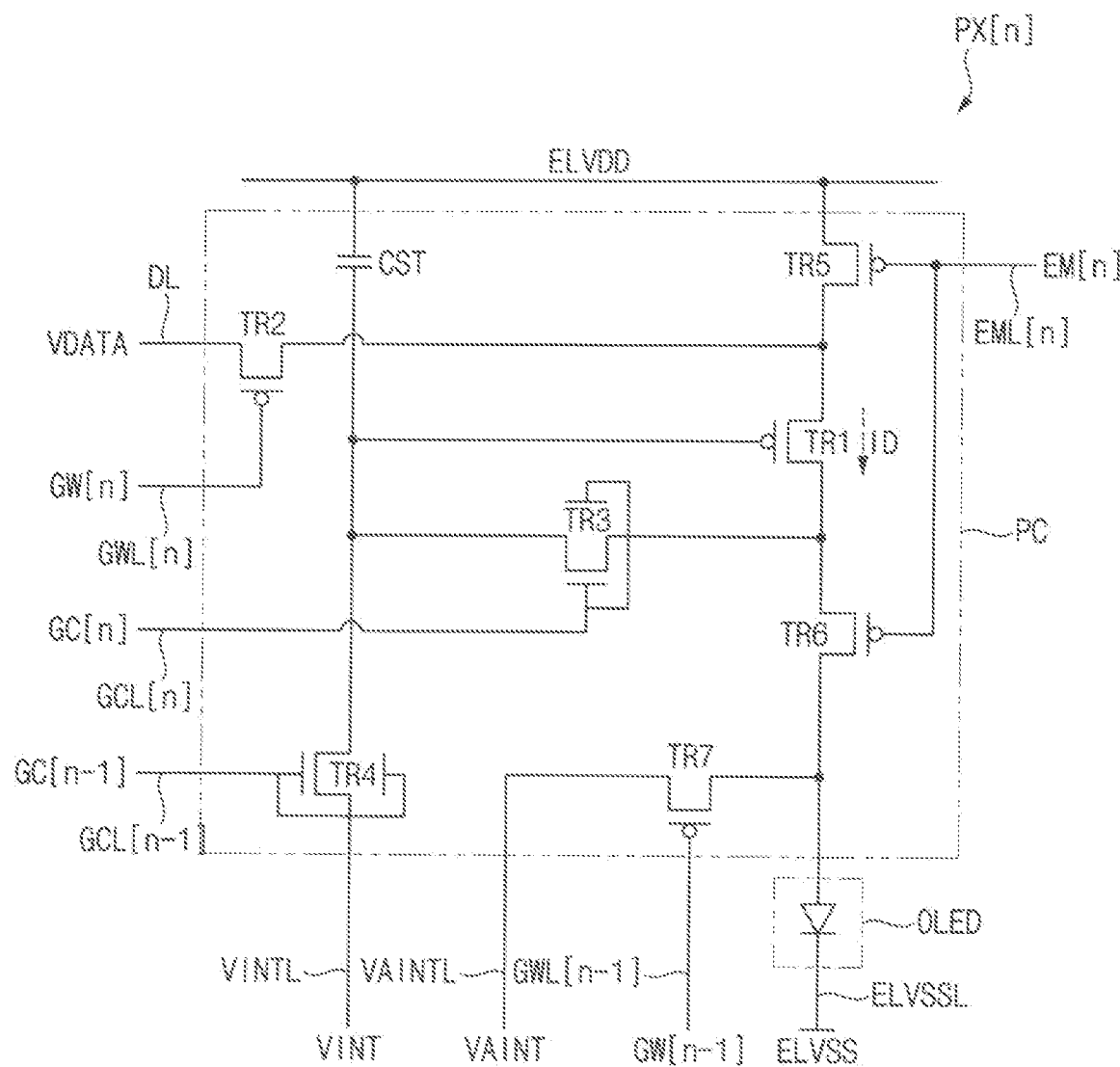
FIG. 4 is a circuit diagram illustrating a pixel included in the display device of FIG. 3.
Figure 5:
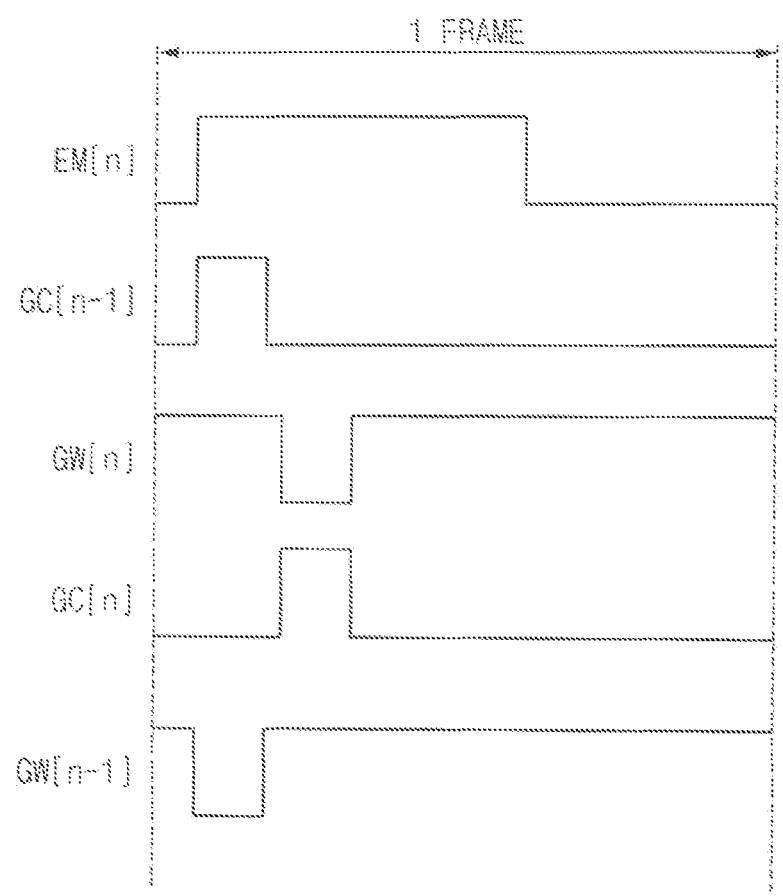
FIG. 5 is a timing diagram for describing signals for driving the pixel of FIG. 4.

FIG. 4 is a circuit diagram illustrating a pixel included in the display device of FIG. 3, and FIG. 5 is a timing diagram for describing signals for driving the pixel of FIG. 4. For example, the pixels PX may be arranged in first to $m^{th}$ pixel rows (where m is an integer that is greater than or equal to 2) in the display panel 110 included in the display device 100, and FIG. 4 shows a pixel PX[n] (where n is an integer between 1 and m) arranged in an $n^{th}$ pixel row among the first to $m^{th}$ pixel rows.

Referring to FIGS. 4 and 5, the display device 100 may include a pixel PX[n], and the pixel PX[n] may include a pixel circuit PC and an organic light emitting element OLED (or a light emitting element). In this case, the pixel circuit PC may include first to seventh pixel transistors TR1, TR2, TR3, TR4, TR5, TR6, and TR7, a pixel storage capacitor CST, and the like. In addition, the pixel circuit PC or the organic light emitting element OLED may be connected to the first power supply voltage line ELVDDL, the second power supply voltage line ELVSSL, the first initialization voltage line VINTL, the second initialization voltage line VAINTL, the data line DL, first gate lines GWL[n-1] and GWL[n], second gate lines GCL[n-1] and GCL[n], an emission line EML[n], and the like. The first pixel transistor TR1 may correspond to a driving transistor, and the second to seventh pixel transistors TR2, TR3, TR4, TR5, TR6, and TR7 may correspond to switching transistors. Each of the first to seventh pixel transistors TR1, TR2, TR3, TR4, TR5, TR6, and TR7 may include a first terminal, a second terminal, and a gate terminal (e.g., a first gate terminal in a case of each of the third and fourth pixel transistors TR3 and TR4). According to some embodiments, the first terminal may be a source terminal, and the second terminal may be a drain terminal. According to some embodiments, the first terminal may be a drain terminal, and the second terminal may be a source terminal.

According to some embodiments, each of the first, second, fifth, sixth, and seventh pixel transistors TR1, TR2, TR5, TR6, and TR7 may be a PMOS transistor, and may have a channel including polysilicon. In addition, each of the third and fourth pixel transistors TR3 and TR4 may be an NMOS transistor, and may have a channel including a metal oxide semiconductor. Furthermore, each of the third and fourth pixel transistors TR3 and TR4 may further include a second gate terminal (e.g., a back gate terminal or a lower gate terminal).

The organic light emitting element OLED may output a light based on a driving current ID. The organic light emitting element OLED may include a first terminal and a second terminal. According to some embodiments, the first terminal of the organic light emitting element OLED may receive the first power supply voltage ELVDD, and the second terminal of the organic light emitting element OLED may receive the second power supply voltage ELVSS. In this case, the first power supply voltage ELVDD and the second power supply voltage ELVSS may be provided from the power supply unit 160 through the first power supply voltage line ELVDDL and the second power supply voltage line ELVSSL, respectively. For example, the first terminal of the organic light emitting element OLED may be an anode terminal, and the second terminal of the organic light emitting element OLED may be a cathode terminal. According to some embodiments, the first terminal of the organic light emitting element OLED may be a cathode terminal, and the second terminal of the organic light emitting element OLED may be an anode terminal.

The first power supply voltage ELVDD may be applied to the first terminal of the first pixel transistor TR1. The second terminal of the first pixel transistor TR1 may be connected to the first terminal of the organic light emitting element OLED. The first initialization voltage VINT may be applied to the gate terminal of the first pixel transistor TR1. In this case, the first initialization voltage VINT may be provided from the power supply unit 160 through the first initialization voltage line VINTL.

The first pixel transistor TR1 may generate the driving current ID. According to some embodiments, the first pixel transistor TR1 may operate in a saturation region. In this case, the first pixel transistor TR1 may generate the driving current ID based on a voltage difference between the gate terminal and the source terminal of the first pixel transistor TR1. In addition, gray levels may be expressed based on a magnitude of the driving current ID supplied to the organic light emitting element OLED. According to some embodiments, the first pixel transistor TR1 may operate in a linear region. In this case, the gray levels may be expressed based on a sum of a time during which the driving current is supplied to the organic light emitting element OLED within one frame.

The gate terminal of the second pixel transistor TR2 may receive a first gate signal GW[n]. In this case, the first gate signal GW[n] may be provided from the gate driver 140 through the first gate line GWL[n]. The first terminal of the second pixel transistor TR2 may receive the data voltage VDATA. In this case, the data voltage VDATA may be provided from the data driver 120 through the data line DL. The second terminal of the second pixel transistor TR2 may be connected to the first terminal of the first pixel transistor TR1. As shown in FIG. 5, the second pixel transistor TR2 may supply the data voltage VDATA to the source terminal of the first pixel transistor TR1 during an activation period of the first gate signal GW[n]. In this case, the second pixel transistor TR2 may operate in a linear region.

Referring again to FIG. 4, the first gate terminal of the third pixel transistor TR3 may receive a second gate signal GC[n]. In this case, the second gate signal GC[n] may be provided from the gate driver 140 through the second gate line GCL[n]. The first terminal of the third pixel transistor TR3 may be connected to the gate terminal of the first pixel transistor TR1. The second terminal of the third pixel transistor TR3 may be connected to the second terminal of the first pixel transistor TR1. In other words, the third pixel transistor TR3 may be connected between the gate terminal of the first pixel transistor TR1 and the second terminal of the first pixel transistor TR1.

As shown in FIG. 5, the third pixel transistor TR3 may connect the gate terminal of the first pixel transistor TR1 to the second terminal of the first pixel transistor TR1 during an activation period of the second gate signal GC[n]. In this case, the third pixel transistor TR3 may operate in a linear region. That is, the third pixel transistor TR3 may diode-connect the first pixel transistor TR1 during the activation period of the second gate signal GC[n]. In other words, the third pixel transistor TR3 may diode-connect the first pixel transistor TR1 in response to the second gate signal GC[n]. Because the first pixel transistor TR1 is diode-connected, a voltage difference corresponding to a threshold voltage of the first pixel transistor TR1 may occur between the first terminal of the first pixel transistor TR1 and the gate terminal of the first pixel transistor TR1. In this case, the threshold voltage may have a negative value. As a result, a voltage obtained by summing up the data voltage VDATA supplied to the first terminal of the first pixel transistor TR1 and the voltage difference (i.e., the threshold voltage) may be supplied to the gate terminal of the first pixel transistor TR1 during the activation period of the first gate signal GW[n]. In other words, the data voltage VDATA may be compensated for by the threshold voltage of the first pixel transistor TR1, and the compensated data voltage VDATA may be supplied to the gate terminal of the first pixel transistor TR1.

As described above, the third pixel transistor TR3 may further include the second gate terminal. The second gate terminal of the third pixel transistor TR3 may be connected to the first gate terminal of the third pixel transistor TR3, and may receive the first gate signal GW[n].

In addition, the third pixel transistor TR3 may include an NMOS transistor, and the NMOS transistor may relatively reduce a leakage current. For example, when the leakage current is generated in the third pixel transistor TR3, a voltage of the gate terminal of the first pixel transistor TR1 may be increased, and the driving current ID may be decreased, so that a luminance may be decreased. Accordingly, when the display device 100 is driven at a low frequency, in order to reduce the leakage current of the third pixel transistor TR3 in a high gray level, the third pixel transistor TR3 may be configured as the NMOS transistor.

Referring again to FIG. 4, the first gate terminal of the fourth pixel transistor TR4 may receive a second gate signal GC[n−1] provided to a pixel PX[n−1] arranged in an $(n-1)^{th}$ pixel row among the first to $m^{th}$ pixel rows. In this case, the second gate signal GC[n−1] provided to the pixel PX[n−1] arranged in the $(n-1)^{th}$ row may be provided from the gate driver 140 through the second gate line GCL[n−1]. The first terminal of the fourth pixel transistor TR4 may receive the first initialization voltage VINT. The second terminal of the fourth pixel transistor TR4 may be connected to the gate terminal of the first pixel transistor TR1 (or the first terminal of the third pixel transistor TR3).

As shown in FIG. 5, the fourth pixel transistor TR4 may supply the first initialization voltage VINT to the gate terminal of the first pixel transistor TR1 during an activation period of the second gate signal GC[n−1] provided to the pixel PX[n−1] arranged in the $(n-1)^{th}$ row. In this case, the fourth pixel transistor TR4 may operate in a linear region. In other words, the fourth pixel transistor TR4 may initialize the gate terminal of the first pixel transistor TR1 to the first initialization voltage VINT during the activation period of the second gate signal GC[n−1] provided to the pixel PX[n−1] arranged in the (n−1)$^{th}$ row. According to some embodiments, the first initialization voltage VINT may have a voltage level that is sufficiently lower than a voltage level of the data voltage VDATA maintained by the pixel storage capacitor CST in a previous frame, and the first initialization voltage VINT may be supplied to the gate terminal of the first pixel transistor TR1. According to some embodiments, the first initialization voltage VINT may have a voltage level that is sufficiently higher than the voltage level of the data voltage VDATA maintained by the pixel storage capacitor CST in the previous frame, and the first initialization voltage VINT may be supplied to the gate terminal of the first pixel transistor TR1.

As described above, the fourth pixel transistor TR4 may further include the second gate terminal. The second gate terminal of the fourth pixel transistor TR4 may be connected to the first gate terminal of the fourth pixel transistor TR4, and may receive the second gate signal GC[n−1] provided to the pixel PX[n−1] arranged in the (n−1)$^{th}$ row.

In addition, the fourth pixel transistor TR4 may include an NMOS transistor, and the NMOS transistor may relatively reduce a leakage current. For example, when the leakage current is generated in in the fourth pixel transistor TR4, the voltage of the gate terminal of the first pixel transistor TR1 may be increased, and the driving current ID may be decreased, so that the luminance may be decreased. Accordingly, when the display device 100 is driven at the low frequency, in order to reduce the leakage current of the fourth pixel transistor TR4 in the high gray level, the fourth pixel transistor TR4 may be configured as the NMOS transistor.

Referring again to FIG. 4, the gate terminal of the fifth pixel transistor TR5 may receive an emission signal EM[n]. In this case, the emission signal EM[n] may be provided from the emission driver 190 through the emission line EML[n]. The first terminal of the fifth pixel transistor TR5 may receive the first power supply voltage ELVDD. The second terminal of the fifth pixel transistor TR5 may be connected to the first terminal of the first pixel transistor TR1.

As shown in FIG. 5, the fifth pixel transistor TR5 may supply the first power supply voltage ELVDD to the first terminal of the first pixel transistor TR1 during an activation period of the emission signal EM[n]. On the contrary, the fifth pixel transistor TR5 may cut off the supply of the first power supply voltage ELVDD during an inactivation period of the emission signal EM[n]. In this case, the fifth pixel transistor TR5 may operate in a linear region. Because the fifth pixel transistor TR5 supplies the first power supply voltage ELVDD to the first terminal of the first pixel transistor TR1 during the activation period of the emission signal EM[n], the first pixel transistor TR1 may generate the driving current ID. In addition, because the fifth pixel transistor TR5 cuts off the supply of the first power supply voltage ELVDD during the inactivation period of the emission signal EM[n], the data voltage VDATA supplied to the first terminal of the first pixel transistor TR1 may be supplied to the gate terminal of the first pixel transistor TR1.

Referring again to FIG. 4, the gate terminal of the sixth pixel transistor TR6 may receive the emission signal EM[n]. The first terminal of the sixth pixel transistor TR6 may be connected to the second terminal of the first pixel transistor TR1. The second terminal of the sixth pixel transistor TR6 may be connected to the first terminal of the organic light emitting element OLED.

As shown in FIG. 5, the sixth pixel transistor TR6 may supply the driving current ID generated by the first pixel transistor TR1 to the organic light emitting element OLED during the activation period of the emission signal EM[n]. In this case, the sixth pixel transistor TR6 may operate in a linear region. In other words, because the sixth pixel transistor TR6 supplies the driving current ID generated by the first pixel transistor TR1 to the organic light emitting element OLED during the activation period of the emission signal EM[n], the organic light emitting element OLED may output the light. In addition, because the sixth pixel transistor TR6 electrically separates the first pixel transistor TR1 and the organic light emitting element OLED from each other during the inactivation period of the emission signal EM[n], the compensated data voltage VDATA supplied to the second terminal of the first pixel transistor TR1 may be supplied to the gate terminal of the first pixel transistor TR1.

Referring again to FIG. 4, the gate terminal of the seventh pixel transistor TR7 may receive a first gate signal GW[n−1] provided to the pixel PX[n−1] arranged in the (n−1)$^{th}$ pixel row among the first to m$^{th}$ pixel rows. In this case, the first gate signal GW[n−1] may be provided from the gate driver 140 through the first gate line GWL[n−1]. The first terminal of the seventh pixel transistor TR7 may receive the second initialization voltage VAINT. The second terminal of the seventh pixel transistor TR7 may be connected to the first terminal of the organic light emitting element OLED.

As shown in FIG. 5, the seventh pixel transistor TR7 may supply the second initialization voltage VAINT to the first terminal of the organic light emitting element OLED during an activation period of the first gate signal GW[n−1] provided to the pixel PX[n−1] arranged in the (n−1)$^{th}$ row. In this case, the seventh pixel transistor TR7 may operate in a linear region. In other words, the seventh pixel transistor TR7 may initialize the first terminal of the organic light emitting element OLED to the second initialization voltage VAINT during the activation period of the first gate signal GW[n−1] provided to the pixel PX[n−1] arranged in the (n−1)$^{th}$ row. According to some embodiments, a first gate signal GW[n+1] provided to a pixel PX[n+1] arranged in an (n+1)$^{th}$ pixel row among the first to m$^{th}$ pixel rows may be provided to the gate terminal of the seventh pixel transistor TR7 instead of the first gate signal GW[n−1] provided to the pixel PX[n−1] arranged in the (n−1)$^{th}$ row.

Referring again to FIG. 4, the pixel storage capacitor CST may be connected between the first power supply voltage line ELVDDL and the gate terminal of the first pixel transistor TR1. The pixel storage capacitor CST may include a first terminal and a second terminal. For example, the first terminal of the pixel storage capacitor CST may receive the first power supply voltage ELVDD, and the second terminal of the pixel storage capacitor CST may be connected to the gate terminal of the first pixel transistor TR1.

As shown in FIG. 5, the pixel storage capacitor CST may maintain a voltage level of the gate terminal of the first pixel transistor TR1 during an inactivation period of the first gate signal GW[n]. The inactivation period of the first gate signal GW[n] may include the activation period of the emission signal EM[n], and the driving current ID generated by the first pixel transistor TR1 may be supplied to the organic light emitting element OLED during the activation period of the emission signal EM[n]. Therefore, the driving current ID generated by the first pixel transistor TR1 may be supplied to the organic light emitting element OLED based on the voltage level maintained by the pixel storage capacitor CST.

According to some embodiments, the first gate signal GW[n] and the second gate signal GC[n] may be signals inverted with respect to each other and having the same voltage level. In addition, the first gate signal GW[n−1] provided to the pixel PX[n−1] arranged in the (n−1)$^{th}$ row and the second gate signal GC[n−1] provided to the pixel PX[n−1] arranged in the (n−1)$^{th}$ row may be signals inverted with respect to each other and having the same voltage level.

However, although the pixel circuit PC according to the present disclosure has been described as including one driving transistor, six switching transistors, and one storage capacitor, the configuration of the present disclosure is not limited thereto. For example, the pixel circuit PC may have a configuration including at least one driving transistor, at least four switching transistors, and at least one storage capacitor.

In addition, although the light emitting element included in the pixel PX according to the present disclosure has been described as including the organic light emitting element OLED, the configuration of the present disclosure is not limited thereto. For example, the light emitting element may include a quantum dot (QD) light emitting element, an inorganic light emitting diode, and the like.

Figure 6:
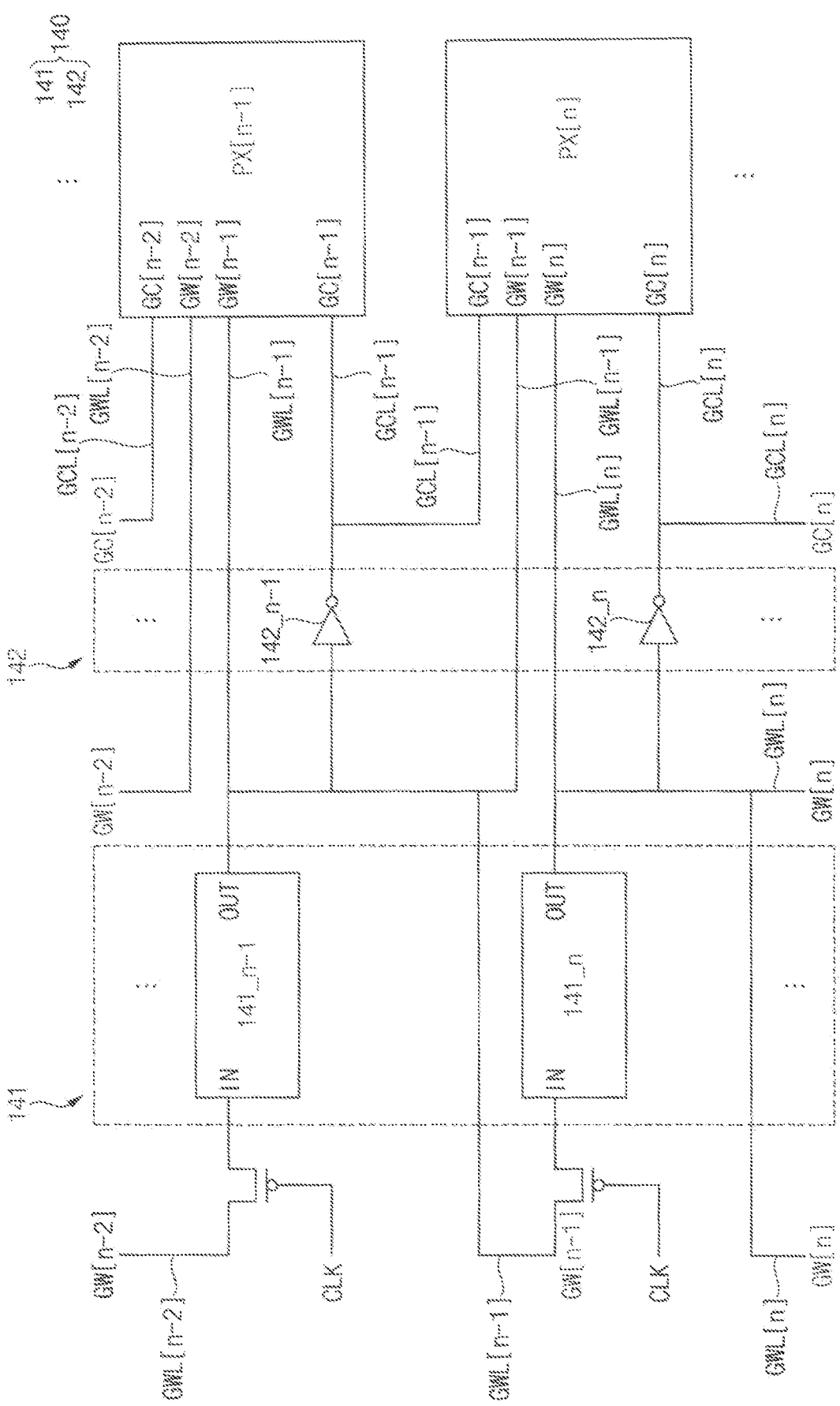
FIG. 6 is a block diagram for describing the gate driver and the pixel in FIG. 3.

FIG. 6 is a block diagram for describing the gate driver and the pixel in FIG. 3. For example, the display panel 110 may include first to m$^{th}$ pixel rows (where m is an integer that is greater than or equal to 2) in which the pixels PX are arranged. FIG. 6 shows first signal generators 141_n−1 and 141_n and second signal generators 142_n−1 and 142_n, which are connected to the pixels PX[n−1] and PX[n] arranged in the (n−1)$^{th}$ and n$^{th}$ pixel rows (where n is an integer between 1 and m) among the first to m$^{th}$ pixel rows.

Referring to FIGS. 2 and 6, the gate driver 140 may include a plurality of first signal generators 141 and a plurality of second signal generators 142.

The first signal generator 141_n−1 among the first signal generators 141 and the second signal generator 142_n−1 among the second signal generators 142 may be connected to the pixel PX[n−1] arranged in the (n−1)$^{th}$ pixel row.

A first gate signal GW[n−2] generated from a first signal generator 141_n−2 based on a clock signal CLK may be provided to an input terminal IN of the first signal generator 141_n−1 through a first gate line GWL[n−2], and the first gate signal GW[n−1] may be output to an output terminal OUT of the first signal generator 141_n−1. The first gate signal GW[n−1] generated from the first signal generator 141_n−1 may be provided to the pixel PX[n−1], the pixel PX[n], and the first signal generator 141_n through the first gate line GWL[n−1].

In addition, the first gate signal GW[n−1] output from the first signal generator 141_n−1 may be provided to the second signal generator 142_n−1, and the first gate signal GW[n−1] provided to the second signal generator 142_n−1 may be converted into the second gate signal GC[n−1] through the second signal generator 142_n−1. The second gate signal GC[n−1] output from the second signal generator 142_n−1 may be provided to the pixel PX[n−1] and the pixel PX[n] through the second gate line GCL[n−1].

Furthermore, the first gate signal GW[n−2] generated from the first signal generator 141_n−2 may be provided to the pixel PX[n−1] through the first gate line GWL[n−2], and a second gate signal GC[n−2] generated from a second signal generator 142_n−2 may be provided to the pixel PX[n−1] through a second gate line GCL[n−2].

The first signal generator 141_n among the first signal generators 141 and the second signal generator 142_n among the second signal generators 142 may be connected to the pixel PX[n] arranged in the n$^{th}$ pixel row.

The first gate signal GW[n−1] generated from the first signal generator 141_n−1 based on the clock signal CLK may be provided to an input terminal IN of the first signal generator 141_n through the first gate line GWL[n−1], and the first gate signal GW[n] may be output to an output terminal OUT of the first signal generator 141_n. The first gate signal GW[n] generated from the first signal generator 141_n may be provided to the pixel PX[n], the pixel PX[n+1], and a first signal generator 141_n+1 through the first gate line GWL[n].

In addition, the first gate signal GW[n] output from the first signal generator 141_n may be provided to the second signal generator 142_n, and the first gate signal GW[n] provided to the second signal generator 142_n may be converted into the second gate signal GC[n] through the second signal generator 142_n. The second gate signal GC[n] output from the second signal generator 142_n may be provided to the pixel PX[n] and the pixel PX[n+1] through the second gate line GCL[n].

Furthermore, as described above, the first gate signal GW[n−1] generated from the first signal generator 141_n−1 may be provided to the pixel PX[n] through the first gate line GWL[n−1], and the second gate signal GC[n−1] generated from the second signal generator 142_n−1 may be provided to the pixel PX[n] through the second gate line GCL[n−1].

According to a pixel circuit included in a conventional display device, four gate signals may be provided to drive pixel transistors included in the pixel circuit. In order to generate the four gate signals, the conventional display device may include at least two gate drivers. In this case, because the conventional display device has a relatively large number of gate drivers and wires connected to the gate drivers, a dead space of the conventional display device may be relatively increased.

Because the display device 100 according to some embodiments of the present disclosure includes the gate driver 140 configured to generate the first gate signals GW and the second gate signals GC, the gate driver 140 may provide the four gate signals provided to the pixel PX by using only the first gate signals GW and the second gate signals GC. Accordingly, a size of the gate driver 140 may be relatively decreased, and the dead space of the display device 100 may be decreased.

Because the display device 100 according to some embodiments of the present disclosure includes the gate driver 140 including the first signal generator 141 configured to generate the first gate signals GW and the second signal generator 142 configured to generate the second gate signals GC, the four gate signals provided to the pixel PX may be generated by only one gate driver 140. Accordingly, because the display device 100 includes only one gate driver 140, the dead space of the display device 100 may be decreased.

Figure 7:
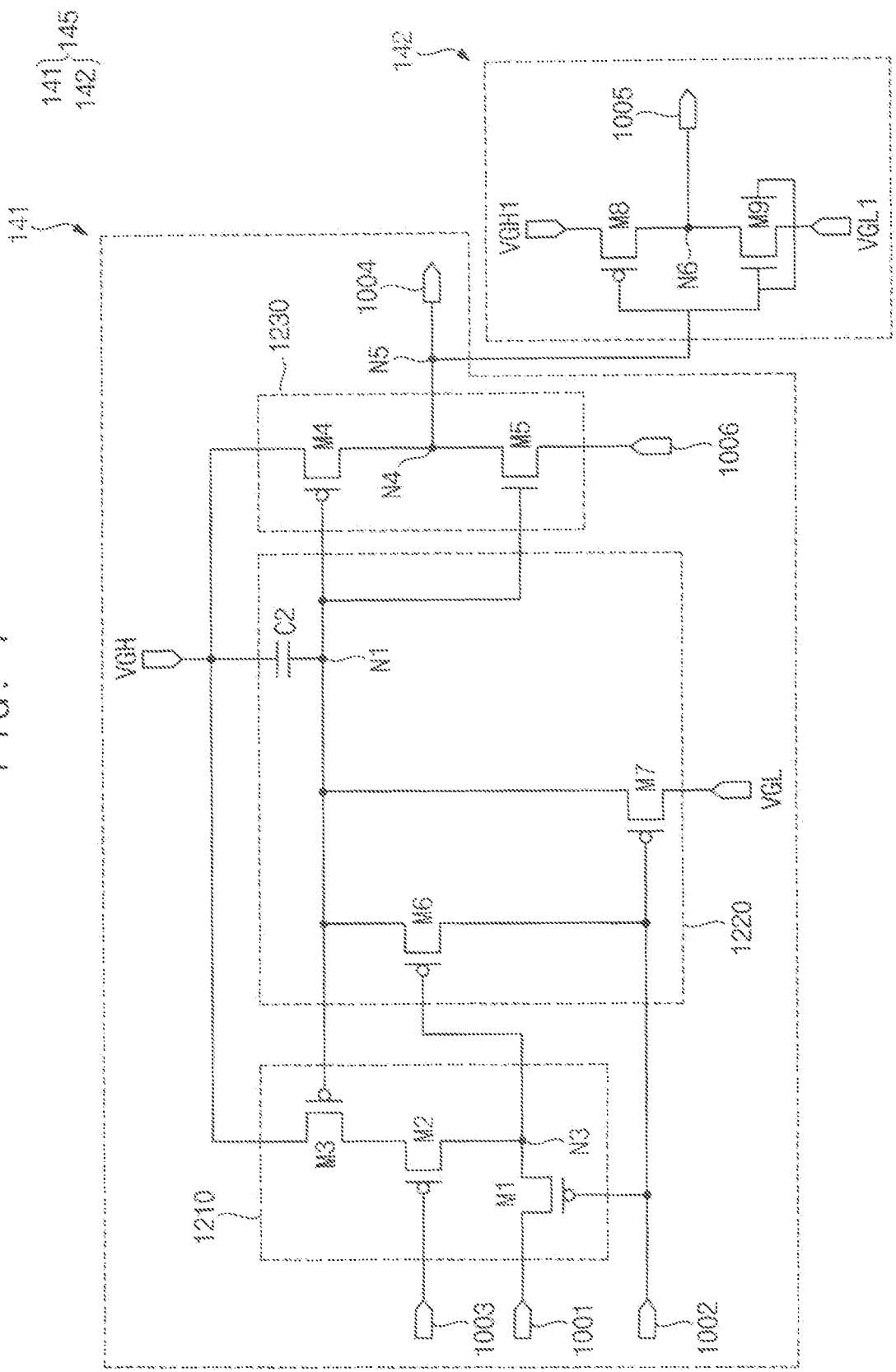
FIG. 7 is a circuit diagram illustrating a gate driver according to some embodiments.

FIG. 7 is a circuit diagram illustrating a gate driver according to some embodiments. A gate driver 145 illustrated in FIG. 7 may have a configuration that is substantially identical or similar to the configuration of the gate driver 140 described with reference to FIG. 1 except for the fifth transistor M5. In FIG. 7, redundant descriptions of components that are substantially identical or similar to the components described with reference to FIG. 1 will be omitted.

Referring to FIG. 7, the gate driver 145 may include a first signal generator 141 and a second signal generator 142. In this case, the first signal generator 141 may include a first driver 1210, a second driver 1220, and an output unit 1230. In addition, the second signal generator 142 may include an eighth transistor M8 and a ninth transistor M9.

The output unit 1230 may include a fourth transistor M4 and a fifth transistor M5. The output unit 1230 may control a voltage supplied to a first output terminal 1004 based on a voltage of a first node N1. The fourth transistor M4 may be connected between the first driving power supply terminal VGH and a fourth node N4, and a gate electrode of the fourth transistor M4 may be connected to the first node N1. The fourth transistor M4 may control connection between the first driving power supply terminal VGH and the first output terminal 1004 based on the voltage applied to the first node N1. In this case, the first output terminal 1004 may be connected to the fourth node N4 (or a fifth node N5). The fifth transistor M5 may be connected between the first output terminal 1004 and a fourth input terminal 1006, and a gate electrode of the fifth transistor M5 may be connected to the first node N1. The fifth transistor M5 may control connection between the first output terminal 1004 and the fourth input terminal 1006 based on the voltage applied to the first node N1. According to some embodiments, the fourth transistor M4 may be a PMOS transistor, and the fifth transistor M5 may be an NMOS transistor.

The second driver 1220 may include a sixth transistor M6, a seventh transistor M7, and a second capacitor C2. The second driver 1220 may control the voltage of the first node N1 based on voltages of the second input terminal 1002 and the third node N3. The second capacitor C2 may be connected between the first node N1 and the first driving power supply terminal VGH. The second capacitor C2 may charge the voltage applied to the first node N1. The sixth transistor M6 may be connected between the first node N1 and the second input terminal 1002, and a gate electrode of the sixth transistor M6 may be connected to the third node N3. The sixth transistor M6 may control connection between the first node N1 and the second input terminal 1002 based on the voltage of the third node N3. The seventh transistor M7 may be connected between the first node N1 and a second driving power supply terminal VGL, and a gate electrode of the seventh transistor M7 may be connected to the second input terminal 1002. The seventh transistor M7 may control connection between the first node Ni and the second driving power supply terminal VGL based on the clock signal of the second input terminal 1002.

According to some embodiments, when compared with the gate driver 140 of FIG. 1, because the gate driver 145 of FIG. 7 includes the fifth transistor M5 configured as an NMOS transistor, the gate driver 145 may not include the first capacitor C1 (e.g., a boosting capacitor) of FIG. 1.

Because the gate driver 145 according to some embodiments of the present disclosure does not include the boosting capacitor (i.e., the first capacitor C1 in FIG. 1), power consumption of the gate driver 145 may be relatively decreased.

Figure 8:
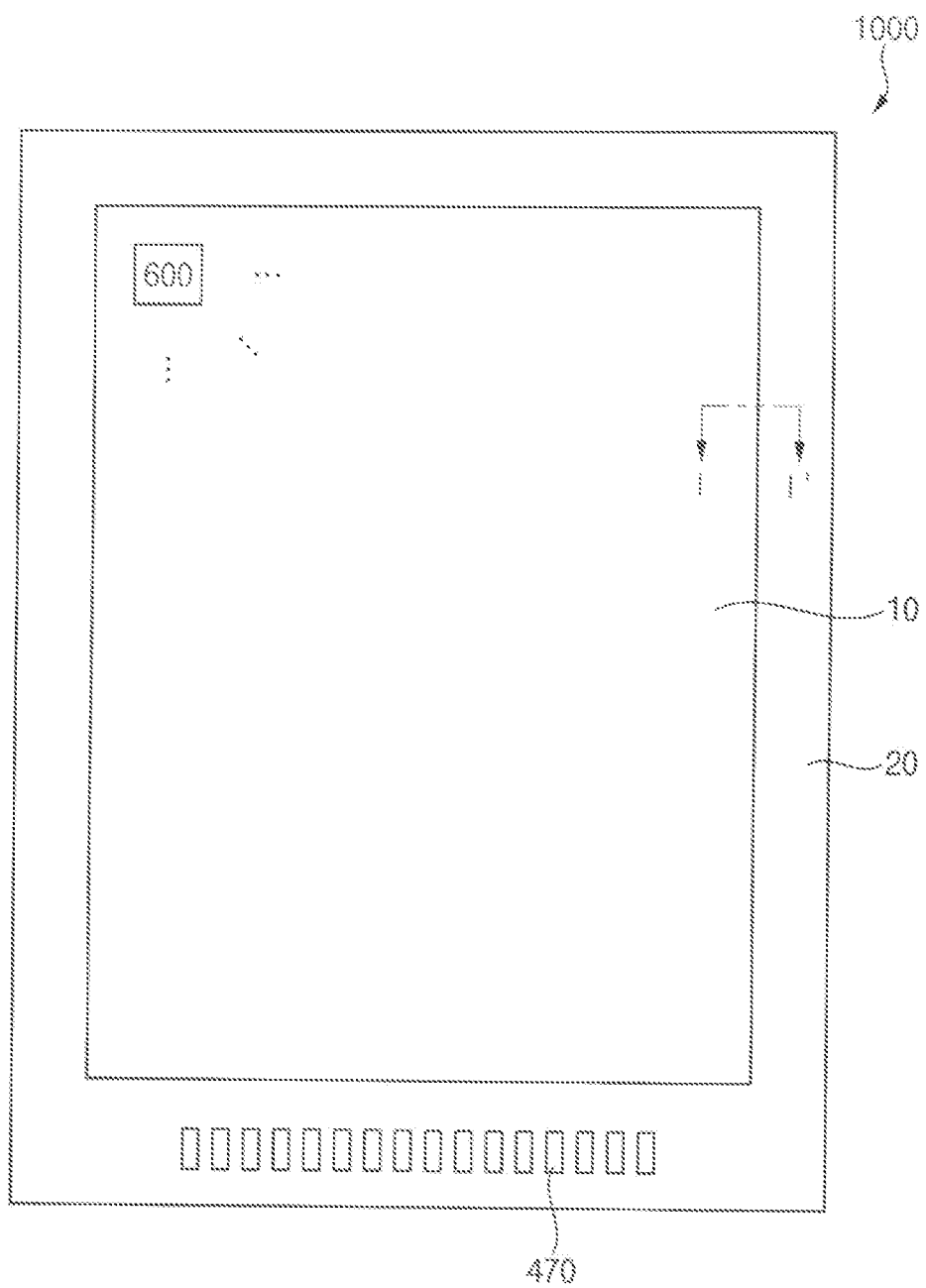
FIG. 8 is a plan view illustrating a display device according to some embodiments.

FIG. 8 is a plan view illustrating a display device according to some embodiments.

Referring to FIG. 8, a display device 1000 may include a display area 10 and a peripheral area 20. A plurality of pixel structures 600 may be located in the display area 10, and pad electrodes 470, a gate driver, a data driver, an emission driver, wires, and the like may be located in the peripheral area 20.

An image may be displayed in the display area 10 through the pixel structures 600, and driving signals may be provided to the pixel structures 600 through the pad electrodes 470.

However, although each of the display area 10, the peripheral area 20, and the pixel structure 600 according to the present disclosure has been described as having a rectangular shape when viewed in a plan view, the shape is not limited thereto. For example, each of the display area 10, the peripheral area 20, and the pixel structure 600 may have a triangular shape, a rhombic shape, a polygonal shape, a circular shape, a track shape, or an elliptical shape when viewed in a plan view.

Figure 9:
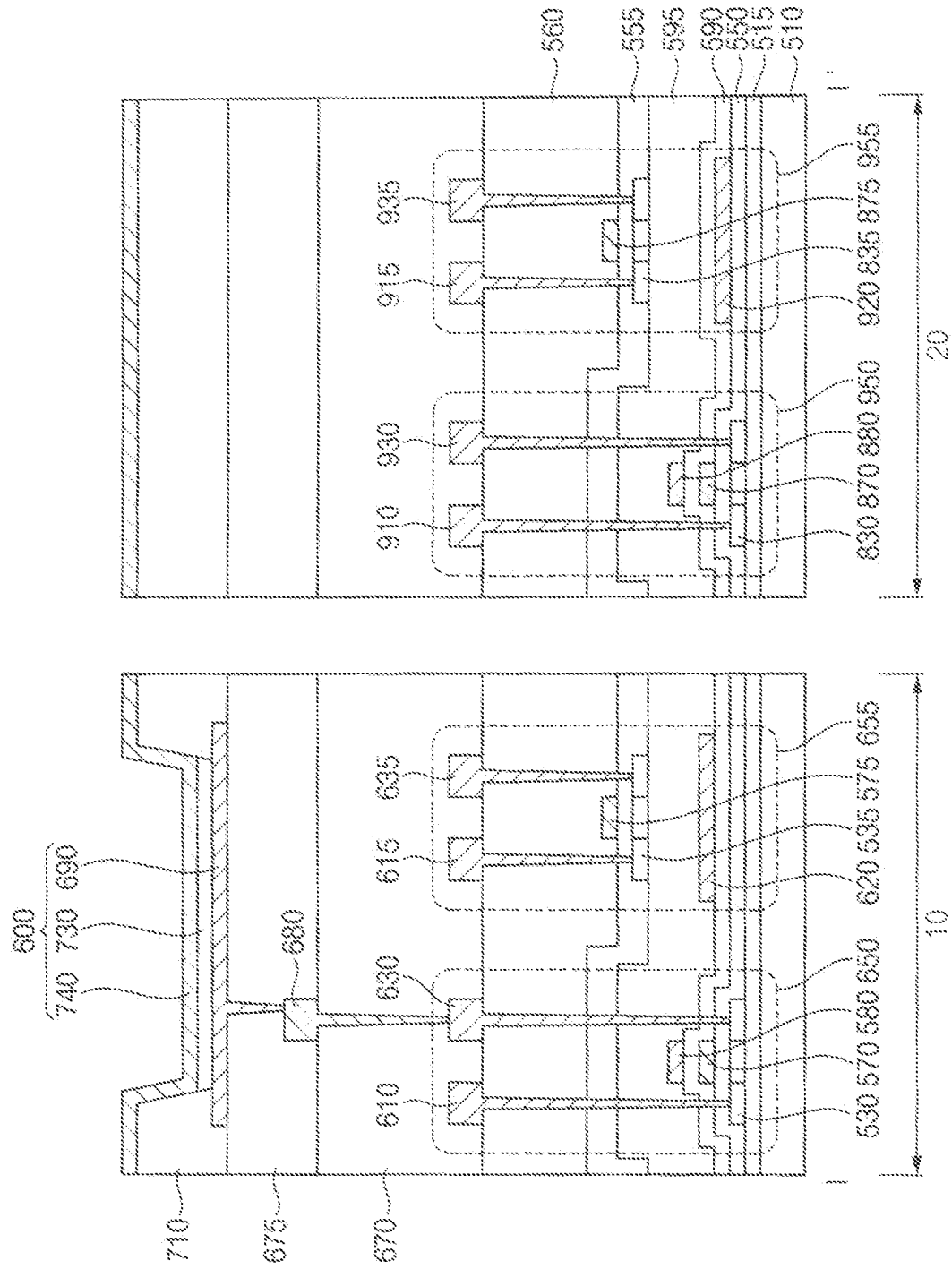
FIG. 9 is a cross-sectional view taken along the line I-I' of FIG. 8.

FIG. 9 is a cross-sectional view taken along the line I-I' of FIG. 8.

Referring to FIG. 9, the display device 1000 may include a substrate 510, a buffer layer 515, a first pixel switching element 650, a second pixel switching element 655, a first switching element 950, a second switching element 955, a first electrode pattern 580, a second electrode pattern 880, a first gate insulating layer 550, a first interlayer insulating layer 590, a second interlayer insulating layer 595, a second gate insulating layer 555, a protective insulating layer 560, a first planarization layer 670, a second planarization layer 675, a connection electrode 680, a pixel structure 600, a pixel defining layer 710, and the like.

In this case, the first pixel switching element 650 may include a first active layer 530, a first gate electrode 570, a first source electrode 610, and a first drain electrode 630, and the second pixel switching element 655 may include a first lower gate electrode 620, a second active layer 535, a second gate electrode 575, a second source electrode 615, and a second drain electrode 635. In addition, the first switching element 950 may include a third active layer 830, a third gate electrode 870, a third source electrode 910, and a third drain electrode 930, and the second switching element 955 may include a second lower gate electrode 920, a fourth active layer 835, a fourth gate electrode 875, a fourth source electrode 915, and a fourth drain electrode 935. Furthermore, the pixel structure 600 may include a lower electrode 690, a light emitting layer 730, and an upper electrode 740.

The substrate 510 including a transparent or opaque material may be provided. The substrate 510 may include a quartz substrate, a synthetic quartz substrate, a calcium fluoride substrate, a fluorine-doped quartz substrate (F-doped quartz substrate), a soda lime glass substrate, a non-alkali glass substrate, and the like. According to some embodiments, the substrate 510 may be configured as a transparent resin substrate having flexibility. An example of the transparent resin substrate that may be used as the substrate 510 may include a polyimide substrate. In this case, the polyimide substrate may have a stacked structure including a first polyimide layer, a barrier film layer, a second polyimide layer, and the like.

Because the display device 1000 includes the display area 10 and the peripheral area 20, the substrate 510 may also be divided into a display area 10 and a peripheral area 20.

The buffer layer 515 may be located on the substrate 510. In other words, the buffer layer 515 may be arranged over the whole substrate 510. The buffer layer 515 may prevent or reduce instances of metal atoms or impurities diffusing from the substrate 510 to the first pixel switching element 650 and the first switching element 950, and may control a heat transfer rate during a crystallization process for forming the first active layer 530 and the third active layer 830 to obtain substantially uniform first and third active layers 530 and 830. In addition, when a surface of the substrate 510 is not uniform, the buffer layer 515 may serve to improve flatness of the surface of the substrate 510. Depending on a type of the substrate 510, at least two buffer layers 515 may be provided on the substrate 510, or the buffer layer 515 may not be provided. The buffer layer 515 may include an organic insulating material or an inorganic insulating material.

The first active layer 530 may be located in the display area 10 on the buffer layer 515, and the third active layer 830 may be located in the peripheral area 20 on the buffer layer 515. Each of the first and third active layers 530 and 830 may include a metal oxide semiconductor, an inorganic semiconductor (e.g., amorphous silicon or polysilicon), an organic semiconductor, or the like. According to some embodiments, each of the first and third active layers 530 and 830 may include polysilicon. Each of the first and third active layers 530 and 830 may have a source region, a drain region, and a channel region located between the source region and the drain region.

The first gate insulating layer 550 may be located on the buffer layer 515, the first active layer 530, and the third active layer 830. In other words, the first gate insulating layer 550 may be arranged over the whole buffer layer 515. The first gate insulating layer 550 may be arranged along a profile of the first and third active layers 530 and 830 with a uniform thickness to cover the first and third active layers 530 and 830 on the buffer layer 515. According to some embodiments, the first gate insulating layer 550 may sufficiently cover the first and third active layers 530 and 830 on the buffer layer 515, and may have a substantially flat top surface without creating a step around the first and third active layers 530 and 830.

The first gate insulating layer 550 may include a silicon compound, metal oxide, and the like. For example, the first gate insulating layer 550 may include silicon oxide ($SiO_x$), silicon nitride ($SiN_x$), silicon oxynitride ($SiO_xN_y$), silicon oxycarbide ($SiO_xC_y$), silicon carbonitride ($SiC_xNy$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. According to some embodiments, the first gate insulating layer 550 may have a multilayer structure including a plurality of insulating layers. the insulating layers may have mutually different materials and mutually different thicknesses.

The first gate electrode 570 may be located in the display area 10 on the first gate insulating layer 550, and the third gate electrode 870 may be located in the peripheral area 20 on the first gate insulating layer 550. In other words, the first gate electrode 570 may be arranged on a portion of the first gate insulating layer 550 under which the first active layer 530 is located to overlap the channel region of the first active layer 530, and the third gate electrode 870 may be arranged on a portion of the first gate insulating layer 550 under which the third active layer 830 is located to overlap the channel region of the third active layer 830. Each of the first and third gate electrodes 570 and 870 may include a metal, an alloy, metal nitride, conductive metal oxide, a transparent conductive material, and the like. These may be used alone or in combination with each other. According to some embodiments, each of the first and third gate electrodes 570 and 870 may have a multilayer structure including a plurality of metal layers. The metal layers may have mutually different materials and mutually different thicknesses.

The second lower gate electrode 920 may be located in the peripheral area 20 on the first gate insulating layer 550 while being spaced apart from the third gate electrode 870. In other words, the second lower gate electrode 920 may be located under a portion of the first gate insulating layer 550 on which the fourth active layer 835 is located to overlap the fourth active layer 835.

According to some embodiments, the second lower gate electrode 920 may be located on the same layer as the first and third gate electrodes 570 and 870, and may include the same material as the first and third gate electrodes 570 and 870. For example, the second lower gate electrode 920 may include old (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like.

According to some embodiments, the second lower gate electrode 920 may function as a back gate of the second switching element 955, and may function as a light blocking layer configured to block an external light from penetrating into the fourth active layer 835. In addition, the second lower gate electrode 920 may be electrically connected to the fourth gate electrode 875.

The first interlayer insulating layer 590 may be located on the first gate insulating layer 550, the first and third gate electrodes 570 and 870, and the second lower gate electrode 920. In other words, the first interlayer insulating layer 590 may be arranged over the whole first gate insulating layer 550. The first interlayer insulating layer 590 may be arranged along a profile of the first and third gate electrodes 570 and 870 and the second lower gate electrode 920 with a uniform thickness to cover the first and third gate electrodes 570 and 870 and the second lower gate electrode 920 on the first gate insulating layer 550.

According to some embodiments, the first interlayer insulating layer 590 may sufficiently cover the first and third gate electrodes 570 and 870 and the second lower gate electrode 920 on the first gate insulating layer 550, and may have a substantially flat top surface without creating a step around the first and third gate electrodes 570 and 870 and the second lower gate electrode 920. The first interlayer insulating layer 590 may include a silicon compound, metal oxide, and the like. According to some embodiments, the first interlayer insulating layer 590 may have a multilayer structure including a plurality of insulating layers. The insulating layers may have mutually different materials and mutually different thicknesses.

The first electrode pattern 580 may be located in the display area 10 on the first interlayer insulating layer 590, and the second electrode pattern 880 may be located in the peripheral area 20 on the first interlayer insulating layer 590. In other words, the first electrode pattern 580 may be located on the first interlayer insulating layer 590 to overlap the first gate electrode 570, and the second electrode pattern 880 may be located on the first interlayer insulating layer 590 to overlap the third gate electrode 870. The first electrode pattern 580 may function as a capacitor together with the first gate electrode 570, and the second electrode pattern 880 may function as a capacitor together with the third gate electrode 870.

Each of the first and second electrode patterns 580 and 880 may include a metal, an alloy, metal nitride, conductive metal oxide, a transparent conductive material, and the like. These may be used alone or in combination with each other. According to some embodiments, each of the first and second electrode patterns 580 and 880 may have a multilayer structure including a plurality of metal layers. The metal layers may have mutually different materials and mutually different thicknesses.

The first lower gate electrode 620 may be located in the display area 10 on the first interlayer insulating layer 590 while being spaced apart from the first electrode pattern 580. In other words, the first lower gate electrode 620 may be located under a portion of the first interlayer insulating layer 590 on which the second active layer 535 is located to overlap the second active layer 535. According to some embodiments, the first lower gate electrode 620 may be located on the same layer as the first and second electrode patterns 580 and 880, and may include the same material as the first and second electrode patterns 580 and 880. In addition, the first lower gate electrode 620 may function as a back gate of the second pixel switching element 655, and may function as a light blocking layer configured to block an external light from penetrating into the second active layer 535. Furthermore, the first lower gate electrode 620 may be electrically connected to the second gate electrode 575.

The second interlayer insulating layer 595 may be located on the first interlayer insulating layer 590, the first and second electrode patterns 580 and 880, and the first lower gate electrode 620. In other words, the second interlayer insulating layer 595 may be arranged over the whole first interlayer insulating layer 590. The second interlayer insulating layer 595 may be arranged along a profile of the first and second electrode patterns 580 and 880 and the first lower gate electrode 620 with a uniform thickness to cover the first and second electrode patterns 580 and 880 and the first lower gate electrode 620 on the first interlayer insulating layer 590.

According to some embodiments, the second interlayer insulating layer 595 may sufficiently cover the first and second electrode patterns 580 and 880 and the first lower gate electrode 620 on the first interlayer insulating layer 590, and may have a substantially flat top surface without creating a step around the first and second electrode patterns 580 and 880 and the first lower gate electrode 620. The second interlayer insulating layer 595 may include a silicon compound, metal oxide, and the like. According to some embodiments, the second interlayer insulating layer 595 may have a multilayer structure including a plurality of insulating layers. The insulating layers may have mutually different materials and mutually different thicknesses.

The second active layer 535 may be located in the display area 10 on the second interlayer insulating layer 595, and the fourth active layer 835 may be located in the peripheral area 20 on the second interlayer insulating layer 595. In other words, the second active layer 535 may be located on the second interlayer insulating layers 595 to overlap the first lower gate electrode 620, and the fourth active layer 835 may be located on the second interlayer insulating layer 595 to overlap the second lower gate electrode 920. Each of the second and fourth active layers 535 and 835 may include a metal oxide semiconductor, an inorganic semiconductor, an organic semiconductor, or the like.

According to some embodiments, each of the second and fourth active layers 535 and 835 may include a metal oxide semiconductor. In other words, each of the second and fourth active layers 535 and 835 may be a metal oxide semiconductor layer including a binary compound (ABX), a ternary compound ($AB_xC_y$), a quaternary compound ($AB_xC_yD_z$), and the like that contain indium (In), zinc (Zn), gallium (Ga), tin (Sn), titanium (Ti), aluminum (Al), hafnium (Hf), zirconium (Zr), magnesium (Mg), and the like. For example, each of the second and fourth active layers 535 and 835 may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and the like. Each of the second and fourth active layers 535 and 835 may have a source region, a drain region, and a channel region located between the source region and the drain region.

The second gate insulating layer 555 may be located on the second interlayer insulating layer 595 and the second and fourth active layers 535 and 835. In other words, the second gate insulating layer 555 may be arranged over the whole second interlayer insulating layer 595. The second gate insulating layer 555 may be arranged along a profile of the second and fourth active layers 535 and 835 with a uniform thickness to cover the second and fourth active layers 535 and 835 on the second interlayer insulating layer 595.

According to some embodiments, the second gate insulating layer 555 may sufficiently cover the second and fourth active layers 535 and 835 on the second interlayer insulating layer 595, and may have a substantially flat top surface without creating a step around the second and fourth active layers 535 and 835. The second gate insulating layer 555 may include a silicon compound, metal oxide, and the like. According to some embodiments, the first gate insulating layer 550 may have a multilayer structure including a plurality of insulating layers. The insulating layers may have mutually different materials and mutually different thicknesses.

The second gate electrode 575 may be located in the display area 10 on the second gate insulating layer 555, and the fourth gate electrode 875 may be located in the peripheral area 20 on the second gate insulating layer 555. In other words, the second gate electrode 575 may be located on a portion of the second gate insulating layer 555 under which the second active layer 535 is located to overlap the channel region of the second active layer 535, and the fourth gate electrode 875 may be located on a portion of the second gate insulating layer 555 under which the fourth active layer 835 is located to overlap the channel region of the fourth active layer 835. Each of the second and fourth gate electrodes 575 and 875 may include a metal, an alloy, metal nitride, conductive metal oxide, a transparent conductive material, and the like. These may be used alone or in combination with each other.

According to some embodiments, each of the second and fourth gate electrodes 575 and 875 may have a multilayer structure including a plurality of metal layers. The metal layers may have mutually different materials and mutually different thicknesses.

The protective insulating layer 560 may be located on the second gate insulating layer 555 and the second and fourth gate electrodes 575 and 875. In other words, the protective insulating layer 560 may be arranged over the whole second gate insulating layer 555. The protective insulating layer 560 may sufficiently cover the second and fourth gate electrodes 575 and 875 on the second gate insulating layer 555, and may have a substantially flat top surface without creating a step around the second and fourth gate electrodes 575 and 875.

According to some embodiments, the protective insulating layer 560 may be arranged along a profile of the second and fourth gate electrodes 575 and 875 with a uniform thickness to cover the second and fourth gate electrodes 575 and 875 on the second gate insulating layer 555. The protective insulating layer 560 may include an organic insulating material or an inorganic insulating material.

According to some embodiments, the protective insulating layer 560 may have a multilayer structure including a plurality of insulating layers. The insulating layers may have mutually different materials and mutually different thicknesses.

The first source electrode 610, the first drain electrode 630, the second source electrode 615, and the second drain electrode 635 may be located in the display area 10 on the protective insulating layer 560, and the third source electrode 910, the third drain electrode 930, the fourth source electrode 915, and the fourth drain electrode 935 may be located in the peripheral area 20 on the protective insulating layer 560.

The first source electrode 610 may pass through first portions of the first gate insulating layer 550, the first interlayer insulating layer 590, the second interlayer insulating layer 595, the second gate insulating layer 555, and the protective insulating layer 560 so as to be connected to the source region of the first active layer 530, and the first drain electrode 630 may pass through second portions of the first gate insulating layer 550, the first interlayer insulating layer 590, the second interlayer insulating layer 595, the second gate insulating layer 555, and the protective insulating layer 560 so as to be connected to the drain region of the first active layer 530.

The third source electrode 910 may pass through third portions of the first gate insulating layer 550, the first interlayer insulating layer 590, the second interlayer insulating layer 595, the second gate insulating layer 555, and the protective insulating layer 560 so as to be connected to the source region of the third active layer 830, and the third drain electrode 930 may pass through fourth portions of the first gate insulating layer 550, the first interlayer insulating layer 590, the second interlayer insulating layer 595, the second gate insulating layer 555, and the protective insulating layer 560 so as to be connected to the drain region of the third active layer 830.

The second source electrode 615 may pass through first portions of the second gate insulating layer 555 and the protective insulating layer 560 so as to be connected to the source region of the second active layer 535, and the second drain electrode 635 may pass through second portions of the second gate insulating layer 555 and the protective insulating layer 560 so as to be connected to the drain region of the second active layer 535.

The fourth source electrode 915 may pass through third portions of the second gate insulating layer 555 and the protective insulating layer 560 so as to be connected to the source region of the fourth active layer 835, and The fourth drain electrode 935 may pass through fourth portions of the second gate insulating layer 555 and the protective insulating layer 560 so as to be connected to the drain region of the fourth active layer 835.

Accordingly, the first pixel switching element 650 including the first active layer 530, the first gate electrode 570, the first source electrode 610, and the first drain electrode 630 may be provided, and the second pixel switching element 655 including the first lower gate electrode 620, the second active layer 535, the second gate electrode 575, the second source electrode 615, and the second drain electrode 635 may be provided. According to some embodiments, the first pixel switching element 650 may be one of the first, second, fifth, sixth, and seventh pixel transistors TR1, TR2, TR5, TR6, and TR7 of FIG. 4, and the second pixel switching element 655 may be one of the third and fourth pixel transistors TR3 and TR4 of FIG. 4.

In addition, the first switching element 950 including the third active layer 830, the third gate electrode 870, the third source electrode 910, and the third drain electrode 930 may be provided, and the second switching element 955 including the second lower gate electrode 920, the fourth active layer 835, the fourth gate electrode 875, the fourth source electrode 915, and the fourth drain electrode 935 may be provided. According to some embodiments, the first switching element 950 may be the eighth transistor M8 of FIG. 1, and the second switching element 955 may be the ninth transistor M9 of FIG. 1.

However, although the display device 1000 has been described as including two transistors and one capacitor in the display area 10 and including two transistors and one capacitor in the peripheral area 20, the configuration of the present disclosure is not limited thereto. For example, the display device 1000 may include at least four transistors and at least one capacitor in the display area 10 and the peripheral area 20.

Referring to FIGS. 1 and 9, a short current may occur in the second signal generator 142 including the eighth transistor M8 and the ninth transistor M9. For example, when the voltage of the fifth node N5 is equal to a voltage of the fourth driving power supply terminal VGL1, Vgs may be 0 volt, and a short current flowing from the third driving power supply terminal VGH1 to the fourth driving power supply terminal VGL1 may occur. In order to prevent or reduce instances of the short current, it is necessary to shift a threshold voltage of the ninth transistor M9, which is an NMOS transistor.

According to some embodiments, in order to shift a threshold voltage of the second switching element 955, the second lower gate electrode 920 may be spaced relatively far apart from the fourth active layer 835. In other words, the first lower gate electrode 620 configured to function as a back gate and the second lower gate electrode 920 configured to function as a back gate may be arranged on mutually different layers. According to some embodiments, the second lower gate electrode 920 may be arranged on the same layer as the first and third active layers 530 and 830 by using the same material as the first and third active layers 530 and 830, or may be located between the buffer layer 515 and the substrate 510.

The first planarization layer 670 may be located on the protective insulating layer 560, the first, second, third, and fourth source electrodes 610, 615, 910, and 915, and the first, second, third, and fourth drain electrodes 630, 635, 930, and 935. In other words, the first planarization layer 670 may be arranged over the whole protective insulating layer 560. The first planarization layer 670 may have a relatively thick thickness, and may have a substantially flat top surface. The first planarization layer 670 may be formed of an organic insulating material or an inorganic insulating material. According to some embodiments, the first planarization layer 670 may include an organic insulating material. For example, the first planarization layer 670 may include a photoresist, a polyacryl-based resin, a polyimide-based resin, a polyimide-based resin, a siloxane-based resin, an acryl-based resin, an epoxy-based resin, and the like.

The connection electrode 680 may be located in the display area 10 on the first planarization layer 670. The connection electrode 680 may pass through a portion of the first planarization layer 670 so as to be connected to the first drain electrode 630. The connection electrode 680 may include a metal, an alloy, metal nitride, conductive metal oxide, a transparent conductive material, and the like. These may be used alone or in combination with each other.

According to some embodiments, the connection electrode 680 may have a multilayer structure including a plurality of metal layers. The metal layers may have mutually different materials and mutually different thicknesses.

The second planarization layer 675 may be located on the first planarization layer 670 and the connection electrode 680. In other words, the second planarization layer 675 may be arranged over the whole first planarization layer 670. The second planarization layer 675 may have a relatively thick thickness, and may have a substantially flat top surface. The second planarization layer 675 may be formed of an organic insulating material or an inorganic insulating material. According to some embodiments, the second planarization layer 675 may include an organic insulating material.

The lower electrode 690 may be located on the second planarization layer 675. The lower electrode 690 may pass through a portion of the second planarization layer 675 so as to be connected to the connection electrode 680, and the lower electrode 690 may be electrically connected to the first pixel switching element 650. The lower electrode 690 may include a metal, an alloy, metal nitride, conductive metal oxide, a transparent conductive material, and the like. These may be used alone or in combination with each other. According to some embodiments, the lower electrode 690 may have a multilayer structure including a plurality of metal layers. The metal layers may have mutually different materials and mutually different thicknesses.

The pixel defining layer 710 may be located on the second planarization layer 675 and a portion of the lower electrode 690. In other words, the pixel defining layer 710 may expose a portion of the lower electrode 690. The pixel defining layer 710 may be formed of an organic insulating material or an inorganic insulating material. According to some embodiments, the pixel defining layer 710 may include an organic insulating material.

The light emitting layer 730 may be located on the lower electrode 690. The light emitting layer 730 may have a multilayer structure including an organic light emission layer EML, a hole injection layer HIL, a hole transport layer HTL, an electron transport layer ETL, an electron injection layer EIL, and the like. The organic light emission layer EML of the light emitting layer 730 may be formed by using at least one of light emitting materials for emitting different color lights (i.e., a red light, a green light, a blue light, etc.) according to sub-pixels. Alternatively, the organic light emission layer EML of the light emitting layer 730 may be formed by stacking a plurality of light emitting materials for generating different color lights such as a red light, a green light, and a blue light to emit a white light as a whole. In this case, a color filter may be located on the light emitting layer 730 located on the lower electrode 690. The color filter may include at least one of a red color filter, a green color filter, or a blue color filter. According to some embodiments, the color filter may include a yellow color filter, a cyan color filter, and a magenta color filter. The color filter may include a photosensitive resin or a color photoresist.

The upper electrode 740 may be located on the light emitting layer 730. The upper electrode 740 may include a metal, an alloy, metal nitride, conductive metal oxide, a transparent conductive material, and the like. These may be used alone or in combination with each other. According to some embodiments, the upper electrode 740 may have a multilayer structure including a plurality of metal layers. For example, the metal layers may have mutually different thicknesses, or may include mutually different materials.

Accordingly, the pixel structure 600 including the lower electrode 690, the light emitting layer 730, and the upper electrode 740 may be provided, and the display device 1000 including the substrate 510, the buffer layer 515, the first pixel switching element 650, the second pixel switching element 655, the first switching element 950, the second switching element 955, the first electrode pattern 580, the second electrode pattern 880, the first gate insulating layer 550, the first interlayer insulating layer 590, the second interlayer insulating layer 595, the second gate insulating layer 555, the protective insulating layer 560, the first planarization layer 670, the second planarization layer 675, the connection electrode 680, the pixel structure 600, and the pixel defining layer 710 may be provided.

Because the display device 1000 according to some embodiments of the present disclosure includes the second lower gate electrode 920 that is spaced relatively far apart from the fourth active layer 835, the threshold voltage of the second switching element 955 may be shifted. Accordingly, instances of the short current occurring in the first switching element 950 and the second switching element 955 may be prevented or reduced.

Figure 10:
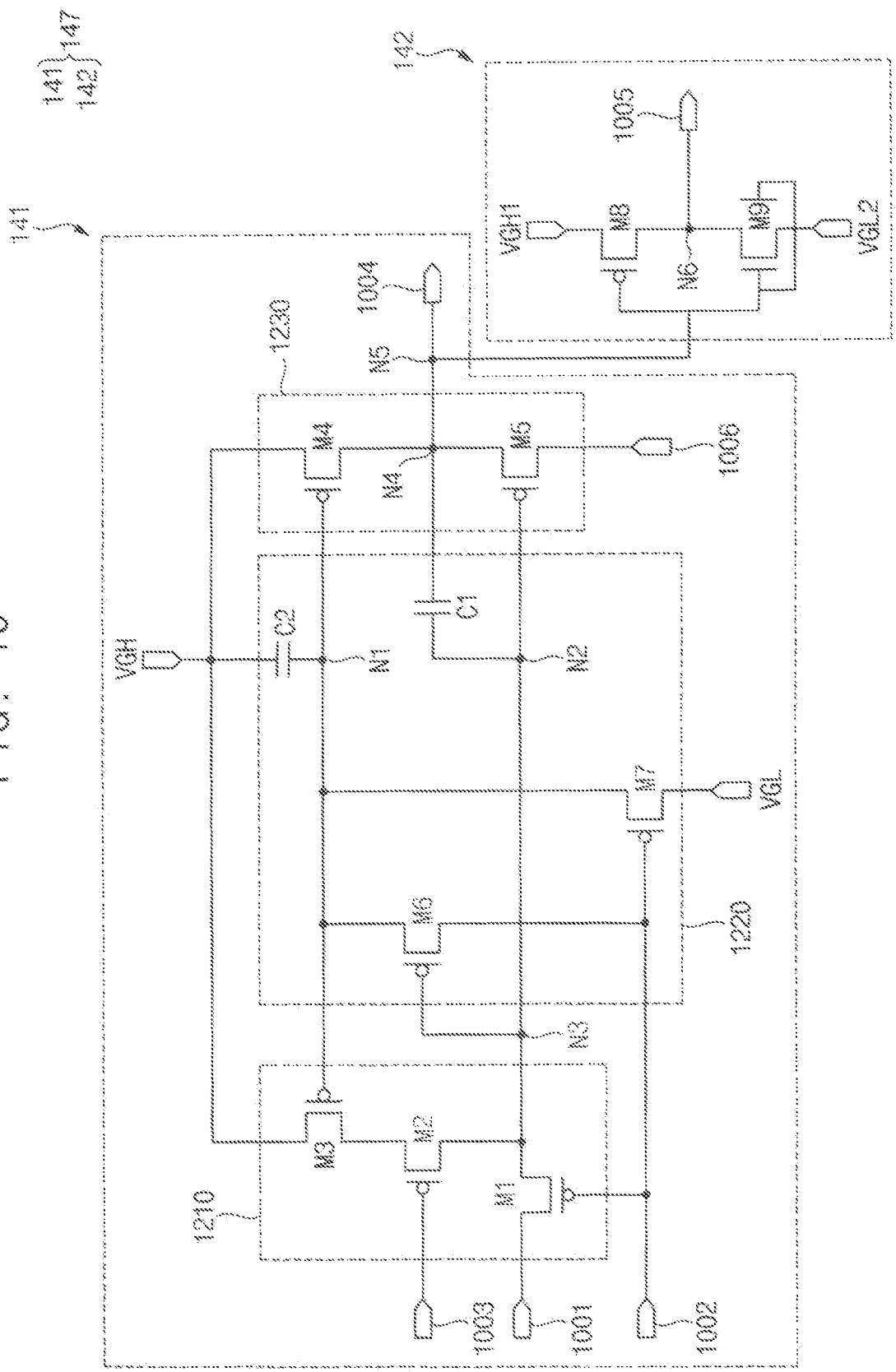
FIG. 10 is a circuit diagram illustrating a gate driver according to some embodiments.

FIG. 10 is a circuit diagram illustrating a gate driver according to some embodiments. A gate driver 147 illustrated in FIG. 10 may have a configuration that is substantially identical or similar to the configuration to the gate driver 140 described with reference to FIG. 1 except for a fifth driving power supply terminal VGL2. In FIG. 10, redundant descriptions of components that are substantially identical or similar to the components described with reference to FIG. 1 will be omitted.

Referring to FIG. 10, the gate driver 147 may include a first signal generator 141 and a second signal generator 142. In this case, the first signal generator 141 may include a first driver 1210, a second driver 1220, and an output unit 1230. In addition, the second signal generator 142 may include an eighth transistor M8 and a ninth transistor M9.

The eighth transistor M8 may be connected between a third driving power supply terminal VGH1 and a sixth node N6, and a gate electrode of the eighth transistor M8 may be connected to the fifth node N5.

The ninth transistor M9 may be connected between the fifth driving power supply terminal VGL2 and the sixth node N6, and a first gate electrode of the ninth transistor M9 may be connected to the fifth node N5. A second gate electrode of the ninth transistor M9 may be connected to the first gate electrode of the ninth transistor M9, and may function as a back gate electrode or a lower gate electrode.

According to some embodiments, the eighth transistor M8 and the ninth transistor M9 may control connection between the third and fifth driving power supply terminals VGH1 and VGL2 and a second output terminal 1005 based on a voltage applied to the fifth node N5. In this case, the second output terminal 1005 may be connected to the sixth node N6. In addition, the eighth transistor M8 may be a PMOS transistor, and the ninth transistor M9 may be a NMOS transistor. In other words, the eighth transistor M8 and the ninth transistor M9 may function as a CMOS transistor. Furthermore, a voltage having the same voltage level may be provided to the third driving power supply terminal VGH1 and the first driving power supply terminal VGH, and voltages having mutually different voltage levels may be provided to the fifth driving power supply terminal VGL2 and the second driving power supply terminal VGL. For example, a voltage of approximately 8 volts may be provided to the first driving power supply terminal VGH and the third driving power supply terminal VGH1, a voltage of approximately −8 volts may be provided to the second driving power supply terminal VGL, and a voltage of −7 volts may be applied to the fifth driving power supply terminal VGL2. In this case, the voltage applied to the fifth node N5 may be different from the voltage of the fifth driving power supply terminal VGL2, and Vgs may be −1 volt. Accordingly, instances of a short current flowing from the third driving power supply terminal VGH1 to the fifth driving power supply terminal VGL2 may be prevented from occurring.

Because the gate driver 147 according to some embodiments of the present disclosure includes the fifth driving power supply terminal VGL2 to which a voltage that is different from the voltage provided to the second driving power supply terminal VGL is provided, instances of the short current occurring in the second signal generator 142 may be prevented or reduced.

Figure 11:
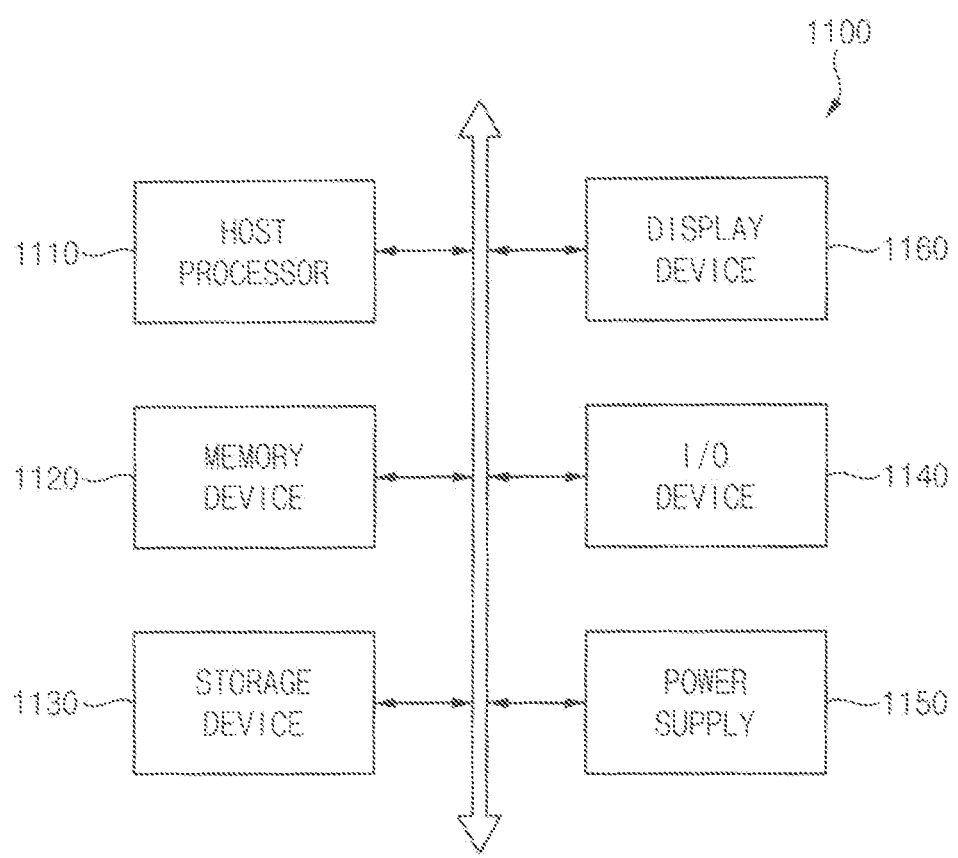
FIG. 11 is a block diagram illustrating an electronic device including a display device according to some embodiments.

FIG. 11 is a block diagram illustrating an electronic device including a display device according to some embodiments.

Referring to FIG. 11, the electronic device 1100 may include a host processor 1110, a memory device 1120, a storage device 1130, an input/output (I/O) device 1140, a power supply 1150, and a display device 1160. The electronic device 1100 may further include a plurality of ports for communicating with a video card, a sound card, a memory card, a universal serial bus (USB) device, other electronic device, and the like.

The host processor 1110 may perform various computing functions. In an embodiment, the processor 1110 may be an application processor (AP), a graphic processing unit (GPU), a microprocessor, a central processing unit (CPU), and the like. The host processor 1110 may be coupled to other components via an address bus, a control bus, a data bus, and the like. Further, the processor 1110 may be coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1130 may include a solid state drive (SSD) device, a hard disk drive (HDD) device, a CD-ROM device, and the like. The I/O device 1140 may include an input device such as a keyboard, a keypad, a mouse device, a touch-pad, a touch-screen, and the like, and an output device such as a printer, a speaker, and the like. The power supply 1150 may provide power for operations of the electronic device 1100. The display device 1160 may be connected to other components via the buses or other communication links.

The display device 1160 may include a display panel including a plurality of pixels, a controller, a data driver, a gate driver, an emission driver, a power supply unit, and the like. In this case, the gate driver may include a first signal generator and a second signal generator. Because the display device 1160 according to some embodiments includes the gate driver including the first signal generator configured to generate first gate signals and the second signal generator configured to generate second gate signals, four gate signals provided to the pixel may be generated by only one gate driver. Accordingly, because the display device 1160 includes only one gate driver, a dead space of the display device 1160 may be decreased.

According to some embodiments, the electronic device 1100 may be implemented as an electronic device such as a cellular phone, a smart phone, a personal computer (PC), a tablet PC, a digital television, a 3D television, a virtual reality (VR) device, a home electronics, a laptop, a personal digital assistant (PDA), a portable multimedia player (PMP), a digital camera, a music player, a portable game console, a car navigation system, etc.

The foregoing is illustrative of the invention and is not to be construed as limiting thereof. Although aspects of some embodiments of the invention have been described, those skilled in the art will readily appreciate that many modifications are possible in the embodiments without materially departing from the novel teachings and characteristics of some embodiments of the present invention. Accordingly, all such modifications are intended to be included within the scope of the invention as defined in the claims, and their equivalents. Therefore, it is to be understood that the foregoing is illustrative of the invention and is not to be construed as limited to the embodiments disclosed, and that modifications to the disclosed embodiments, as well as other embodiments can be made.

Aspects of embodiments according to the present disclosure may be applied to various electronic devices including a display device. For example, aspects of some embodiments of the present invention may be applied to numerous electronic devices such as vehicle display devices, ship display devices, aircraft display devices, portable communication devices, exhibition display devices, information transmission display devices, and medical display devices.

What is claimed is:

1. A display device comprising:
a display panel including first to $m^{th}$ pixel rows in which pixels are arranged, where m is an integer greater than or equal to 2; and
a gate driver including first to $m^{th}$ signal generators configured to generate first to $m^{th}$ gate signals, respectively and first to $m^{th}$ inverted signal generators configured to generate first to $m^{th}$ inverted gate signals, respectively,
wherein an $(n-1)^{th}$ gate signal, where n is an integer between 1 and m, generated by an $(n-1)^{th}$ signal generator among the first to $m^{th}$ signal generators, an $(n-1)^{th}$ inverted gate signal generated by an $(n-1)^{th}$ inverted signal generator among the first to $m^{th}$ inverted signal generators, an $n^{th}$ gate signal generated by an $n^{th}$ signal generator among the first to $m^{th}$ signal generators, and an $n^{th}$ inverted gate signal generated by an $n^{th}$ inverted signal generator among the first to $m^{th}$ inverted signal generators are provided to an $n^{th}$ pixel row among the first to $m^{th}$ pixel rows,
wherein the $(n-1)^{th}$ gate signal and the $(n-1)^{th}$ inverted gate signal are signals inverted with respect to each other and having a same voltage level,
wherein the $n^{th}$ gate signal and the $n^{th}$ inverted gate signal are signals inverted with respect to each other and having a same voltage level, and
wherein each of the pixels arranged in the $n^{th}$ pixel row includes:

a light emitting element configured to output a light based on a driving current, and including a first terminal and a second terminal;

a first pixel transistor including a first terminal to which a first power supply voltage is applied, a second terminal connected to the first terminal of the light emitting element, and a gate terminal, and configured to generate the driving current;

a second pixel transistor including a first terminal to which a data voltage is applied, a second terminal connected to the first terminal of the first pixel transistor, and a gate terminal to which the $n^{th}$ gate signal is applied; and a third pixel transistor including a first terminal connected to the second terminal of the first pixel transistor, a second terminal connected to the gate terminal of the first pixel transistor, and a first gate terminal to which the $n^{th}$ inverted gate signal is applied.

2. The display device of claim 1, wherein the third pixel transistor further includes a second gate terminal connected to the first gate terminal of the third pixel transistor, and configured to function as a back gate, and wherein the third pixel transistor is an NMOS transistor.

3. The display device of claim 1, wherein each of the pixels arranged in the $n^{th}$ pixel row further includes:

a fourth pixel transistor including a first terminal to which a first initialization voltage is applied, a second terminal connected to the second terminal of the third pixel transistor, and a first gate terminal to which the $(n-1)^{th}$ inverted gate signal is applied.

4. The display device of claim 3, wherein the fourth pixel transistor further includes a second gate terminal connected to the first gate terminal of the fourth pixel transistor, and configured to function as a back gate, and wherein the fourth pixel transistor is an NMOS transistor.

5. The display device of claim 3, wherein each of the pixels arranged in the $n^{th}$ pixel row further includes:

a fifth pixel transistor including a first terminal to which a second initialization voltage is applied, a second terminal connected to the first terminal of the light emitting element, and a gate terminal to which the $(n-1)^{th}$ gate signal is applied.

6. The display device of claim 5, wherein the first, second, and fifth pixel transistors are PMOS transistors.

7. A display device comprising:

a substrate including a display area and a peripheral area;

a first pixel switching element in the display area on the substrate, and including a first active layer including a metal oxide semiconductor, a first gate electrode on the first active layer, and a first lower gate electrode under the first active layer;

a first switching element in the peripheral area on the substrate, and including a second active layer including a metal oxide semiconductor, a second gate electrode on the second active layer, and a second lower gate electrode under the second active layer; and a pixel structure in the display area on the first pixel switching element, wherein the first lower gate electrode and the second lower gate electrode are on mutually different layers.

8. The display device of claim 7, further comprising:

a second pixel switching element including a third active layer, a third gate electrode on the third active layer, and an electrode pattern on the third gate electrode and defined as a capacitor together with the third gate electrode.

9. The display device of claim 8, wherein the first lower gate electrode and the electrode pattern are on a same layer, and wherein the second lower gate electrode and the third gate electrode are on a same layer.

10. The display device of claim 8, further comprising:

a gate insulating layer covering the third active layer, and in the display area and the peripheral area on the substrate; and an interlayer insulating layer covering the third gate electrode and the second lower gate electrode, and in the display area and the peripheral area on the gate insulating layer.

11. The display device of claim 10, wherein a bottom surface of the first lower gate electrode makes contact with the interlayer insulating layer, and wherein a bottom surface of the second lower gate electrode makes contact with the gate insulating layer.

\* \* \* \* \*